United States Patent
Yuan et al.

(10) Patent No.: US 12,250,867 B2
(45) Date of Patent: Mar. 11, 2025

(54) DISPLAY PANEL AND TEST METHOD THEREOF, DISPLAY APPARATUS

(71) Applicants: HEFEI BOE JOINT TECHNOLOGY CO., LTD., Hefei (CN); BOE TECHNOLOGY GROUP CO., LTD., Beijing (CN)

(72) Inventors: Zhidong Yuan, Beijing (CN); Pan Xu, Beijing (CN); Yongqian Li, Beijing (CN); Can Yuan, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/791,262

(22) PCT Filed: Sep. 28, 2021

(86) PCT No.: PCT/CN2021/121293
§ 371 (c)(1),
(2) Date: Jul. 7, 2022

(87) PCT Pub. No.: WO2023/050055
PCT Pub. Date: Apr. 6, 2023

(65) Prior Publication Data
US 2024/0215422 A1    Jun. 27, 2024

(51) Int. Cl.
*H10K 59/88* (2023.01)
*G01R 31/28* (2006.01)
(Continued)

(52) U.S. Cl.
CPC ......... *H10K 59/88* (2023.02); *G01R 31/2884* (2013.01); *G09G 3/3233* (2013.01);
(Continued)

(58) Field of Classification Search
CPC .... G01R 31/2884; H10K 59/88; H10K 71/70; G09G 2300/0408; G09G 2300/0413;
(Continued)

(56) References Cited

U.S. PATENT DOCUMENTS

| | | | |
|---|---|---|---|
| 10,162,440 B2 | 12/2018 | Jin et al. | |
| 2006/0001622 A1 | 1/2006 | Kim et al. | |
| 2008/0135846 A1 | 6/2008 | Shin et al. | |
| 2012/0099043 A1* | 4/2012 | Sun | G09G 3/3611 438/34 |

(Continued)

FOREIGN PATENT DOCUMENTS

| | | |
|---|---|---|
| CN | 101391346 A | 3/2009 |
| CN | 102455554 A | 5/2012 |

(Continued)

*Primary Examiner* — Priyank J Shah
(74) *Attorney, Agent, or Firm* — Dilworth & Barrese, LLP.; Michael J. Musella, Esq.

(57) ABSTRACT

A display panel, and a test method thereof, a display apparatus, each subpixel of the pixel array of the display panel includes a pixel circuit, a first signal line configured to provide a scanning signal to the pixel circuit, a scan driver circuit configured to provide the scanning signal to the pixel circuit and includes a shift register and a clock signal line in the display area; a test circuit board in the non-display area and including a test pad; and a test lead in the non-display area and electrically connected with the test pad. The first signal line includes a first part in the display area and a second part in the non-display area, the first part extends substantially along the first direction.

20 Claims, 19 Drawing Sheets

(51) Int. Cl.
*G09G 3/3233* (2016.01)
*G09G 3/3266* (2016.01)
*H10K 71/70* (2023.01)

(52) U.S. Cl.
CPC ........... *G09G 3/3266* (2013.01); *H10K 71/70* (2023.02); *G09G 2300/0408* (2013.01); *G09G 2300/0842* (2013.01); *G09G 2310/0286* (2013.01); *G09G 2310/08* (2013.01); *G09G 2330/12* (2013.01)

(58) Field of Classification Search
CPC ............. G09G 2330/12; G09G 3/3233; G09G 3/3266; G09G 3/3275
See application file for complete search history.

(56) References Cited

U.S. PATENT DOCUMENTS

2016/0140896 A1* 5/2016 Kwon .................... G09G 3/006
345/76
2022/0077273 A1 3/2022 Qing et al.

FOREIGN PATENT DOCUMENTS

| CN | 102540595 A | 7/2012 |
| CN | 104777637 A | 7/2015 |
| CN | 108803177 A | 11/2017 |
| CN | 110867139 A | 3/2020 |
| CN | 111025793 A | 4/2020 |
| CN | 111308815 A | 6/2020 |
| CN | 112838106 A | 5/2021 |
| CN | 113380656 A | 9/2021 |

* cited by examiner

DISPLAY PANEL AND TEST METHOD THEREOF, DISPLAY APPARATUS

TECHNICAL FIELD

At least one embodiment of the present disclosure relates to a display panel and a test method thereof, and a display apparatus.

BACKGROUND

Generally, an organic light-emitting diode (OLED) display device includes a display panel, a gate driver, a data driver, and a timing controller. The display panel includes a pixel array, the pixel array includes a plurality of rows of pixels and a plurality of columns of pixels, and data lines and gate lines that control the operation of each row of pixels. Generally, when the gate driver signal is supplied to the gate line, the pixels in the pixel row corresponding to the gate line are supplied with the data voltage of the data line, and the pixels emit light with different brightness according to the data voltage.

The gate driver provides a gate driver signal to the gate line, and the gate driver includes a scan driver circuit. It is necessary to test the scanning drive circuit to determine whether the scanning drive circuit works normally.

SUMMARY

At least one embodiment of the present disclosure provides a display panel, comprising: a base substrate, a pixel array, a scan driver circuit, a test circuit board, and a test lead. The base substrate comprises a display area and a non-display area at least partially surrounding the display area; the pixel array is in the display area on the base substrate and comprises a plurality of pixel rows extending in a first direction, each pixel row of the plurality of pixel rows comprises a first signal line and subpixels, and each subpixel comprises a pixel circuit, and the first signal line is configured to provide a scanning signal to the pixel circuit in the pixel row where the first signal line is located; the scan driver circuit is configured to provide the scanning signal to the pixel circuit and comprises a shift register and a clock signal line that are in the display area; the test circuit board is in the non-display area and comprises a test pad; and the test lead is in the non-display area and electrically connected with the test pad, the first signal line comprises a first part in the display area, and a second part that is in the non-display area and is connected with the first part, the first part extends substantially along the first direction, and the second part is connected with the first part; before the display panel is tested, the first signal line and the test lead are arranged in different layers and insulated from each other; when the display panel is tested, the test lead and the second part of the first signal line are connected to each other, and the test circuit board is configured to acquire a test signal from the first signal line through the test pad and the test lead.

For example, in the display panel provided by at least an embodiment of the present disclosure, before the display panel is tested, an orthographic projection of the second part of the first signal line on the base substrate at least partially overlaps with an orthographic projection of the test lead on the base substrate; when the display panel is tested, an orthographic projection of a part of the second part of the first signal line on the base substrate overlaps with an orthographic projection of a part of the test lead on the base substrate, and the overlapped part of the second part of the first signal line is connected to the overlapped part of the test lead.

For example, the display panel provided by at least an embodiment of the present disclosure further comprises an interlayer insulation layer, wherein, before the display panel is tested, the interlayer insulation layer is between the first signal line and the test lead to insulate the first signal line and the test lead, and the first signal line, the interlayer insulation layer, and the test lead are configured to be melted by laser at a preset position to enable the first signal line to be electrically connected with the test lead at the preset position, and the preset position is located in an overlapping region where the orthographic projection of the first signal line on the base substrate overlaps with the orthographic projection of the test lead on the base substrate.

For example, in the display panel provided by at least an embodiment of the present disclosure, before the display panel is tested, the test lead is at a side of the first signal line away from the base substrate, and no conductive layer is between the first signal line and the base substrate; or, the test lead is on a side of the first signal line near the base substrate, and no conductive layer is between the test lead and the base substrate.

For example, in the display panel provided by at least an embodiment of the present disclosure, the first signal line is a gate line.

For example, in the display panel provided by at least an embodiment of the present disclosure, a gap area is provided between adjacent pixel rows of the plurality of pixel rows, and the shift register and the clock signal line are in the gap area.

For example, in the display panel provided by at least an embodiment of the present disclosure, each pixel row of the plurality of pixel rows comprises a plurality of the first signal lines, the display panel comprises a plurality of the test pads and a plurality of the test leads, and each of the plurality of test pads is electrically connected with at least one test lead of the plurality of test leads in the non-display area; before the display panel is tested, an orthographic projection of each of the plurality of test leads on the base substrate at least partially overlaps with an orthographic projection of the second parts of the plurality of first signal lines in at least one of the pixel rows of the display panel on the base substrate.

For example, in the display panel provided by at least an embodiment of the present disclosure, before the display panel is tested, the orthographic projection of each of the plurality of test leads on the base substrate at least partially overlaps with the orthographic projection of the second parts of the plurality of first signal lines of one same pixel row of the plurality of pixel rows on the base substrate, or, the orthographic projection of each of the plurality of test leads on the base substrate at least partially overlaps with the orthographic projection of the second parts of the plurality of first signal lines of adjacent pixel rows of the plurality of pixel rows on the base substrate.

For example, in the display panel provided by at least an embodiment of the present disclosure, no switch device is provided between each of the plurality of first signal lines and the test lead of which the orthographic projection overlaps with the orthographic projection of the each of the plurality of first signal lines.

For example, in the display panel provided by at least an embodiment of the present disclosure, each of the plurality of test leads comprises: a main lead and a plurality of sub-leads. The main lead comprises a first end connected with each of the test pads and a second end away from the test pads, the second end extends along a second direction, and the second direction is substantially perpendicular to the first direction; and the plurality of sub-leads are connected with the second end of the main lead, protrude from the second end, and are provided in one-to-one correspondence with the first signal lines. Before the display panel is tested, an orthographic projection of each of the sub-leads on the base substrate at least partially overlaps with the orthographic projection of the second part of the corresponding first signal line on the base substrate.

For example, in the display panel provided by at least an embodiment of the present disclosure, before the display panel is tested, an end of the second part of each of the plurality of first signal lines that is near the corresponding sub-lead has a first test pad, and a width of the first test pad in a line width direction of the each of the plurality of first signal lines is larger than a line width of the each of the plurality of first signal lines; a first end of each of the plurality of sub-leads is connected with the main lead, and a second end of each of the plurality of sub-leads has a second test pad, a width of the second test pad in a line width direction of the each of the plurality of sub-leads is larger than a line width of the each of the plurality of sub-leads; an orthographic projection of the second test pad on the base substrate at least partially overlaps with an orthographic projection of the first test pad of the corresponding first signal line on the base substrate.

For example, in the display panel provided by at least an embodiment of the present disclosure, the first test pads of the plurality of first signal lines are spaced apart from each other along the second direction, the plurality of sub-leads in one-to-one correspondence with the plurality of first signal lines are spaced apart from each other along the second direction, and the second test pads of the plurality of sub-leads are spaced apart from each other along the second direction.

For example, in the display panel provided by at least an embodiment of the present disclosure, the second part comprises: a first transverse part extending along the first direction and connected with the first part. An end of the first transverse part away from the first part comprises the first test pad, and the first transverse parts of the plurality of first signal lines are arranged along the second direction.

For example, in the display panel provided by at least an embodiment of the present disclosure, the second part comprises: a first transverse part, a first longitudinal part, and a second transverse part. The first transverse part extends in the first direction and connected with the first part; the first longitudinal part is connected with the first transverse part and extends along the second direction; and the second transverse part is connected with the first longitudinal part and extends along the first direction. The end of the second transverse part away from the first longitudinal part comprises the first test pad, the first transverse parts of the plurality of first signal lines are arranged in the second direction, the second transverse parts of the plurality of first signal lines are arranged in the second direction, and the first test pads of the plurality of first signal lines are not on a same straight line extending along the second direction.

For example, in the display panel provided by at least an embodiment of the present disclosure, the pixel circuit comprises a light-emitting element, a driving transistor, a data writing transistor, and a storage capacitor; the data writing transistor is configured to transmit the data signal to the driving transistor under control of the scanning signal, and the driving transistor is configured to control magnitude of a driving current flowing through the light-emitting element according to the data signal; the storage capacitor comprises a first plate and a second plate, the first plate is electrically connected with a gate of the driving transistor, and an orthographic projection of the second plate on the base substrate at least partially overlaps with an orthographic projection of the first plate on the base substrate; before the display panel is tested, the first signal lines are in a same layer as the first plate of the storage capacitor, and the test lead is in a same layer as the second plate of the storage capacitor, or the first signal lines are in a same layer as the first plate of the storage capacitor, and the display panel further comprises a light shielding layer. The light shielding layer is on a side of the first signal lines near the base substrate, and an orthographic projection of the channel region of the driving transistor on the base substrate is within an orthographic projection of the light shielding layer on the base substrate, and the test leads are in a same layer as the light shielding layer.

For example, the display panel provided by at least an embodiment of the present disclosure display panel further comprises a plurality of alignment marks, patterns of the plurality of alignment marks are different from each other, are provided in one-to-one correspondence with the plurality of first signal lines, and each of the alignment marks is spaced apart from the overlapping region of the corresponding first signal line; when the display panel is tested, the plurality of alignment marks are configured to be recognized by an alignment device to locate the preset positions in the overlapping areas of the corresponding first signal lines; the alignment marks are in a same layer as any one selected from a group consisting of an active layer of the driving transistor, the first signal line and the test lead.

For example, in the display panel provided by at least an embodiment of the present disclosure, the test circuit board is a chip on film (COF), and the test pads are spaced apart from each other in the chip on film.

For example, in the display panel provided by at least an embodiment of the present disclosure, the non-display area comprises a first non-display area, a second non-display area, and a third non-display area, the first non-display area and the second non-display area are respectively on a first side and a second side of the display area in the first direction, and the third non-display area is on a first side of the display area in the second direction; the base substrate comprises a first edge that is near the first non-display area and extends in the second direction, a second edge that is near the second non-display area and extends in the second direction, and a third edge that is near the third non-display area and extends in the first direction; the first signal lines of the plurality of pixel rows all extend from the display area to the first non-display area, and the first signal lines of the plurality of pixel rows are connected with the test leads in the first non-display area; the plurality of test pads are in the third non-display area and arranged along the third edge of the base substrate, or, the plurality of test pads are in the first non-display area and arranged along the first edge of the base substrate.

For example, in the display panel provided by at least an embodiment of the present disclosure, a first part of the first signal lines of the plurality of pixel rows extends from the display area to the first non-display area, and the first part of the first signal lines is connected with the test leads in the first non-display area; a second part of the first signal lines of the pixel rows extends from the display area to the second non-display area, and the second part of the first signal lines is connected with the test leads in the second non-display area; a first part of the plurality of test pads is in the first non-display area and arranged along the first edge of the base substrate, and a second part of the plurality of test pads is in the second non-display area and arranged along the second edge of the base substrate, or, the first part of the test pads and the second part of the test pads are both in the third non-display area and arranged along the third edge of the base substrate.

At least one embodiment of the present disclosure also provides a display panel, comprising: a base substrate, a pixel array, a scan driver circuit, a test circuit board, and a test lead. The base substrate comprises a display area and a non-display area at least partially surrounding the display area; the pixel array is in the display area of the base substrate and comprises a plurality of pixel rows extending in the first direction, each pixel row of the plurality of pixel rows comprises a first signal line and subpixels, and each subpixel comprises a pixel circuit, and the first signal line is configured to provide a scanning signal to the pixel circuit in the pixel row where the first signal line is located; the scan driver circuit is configured to provide the scanning signal to the pixel circuit and comprises a shift register and a clock signal line that are in the display area; the test circuit board is in the non-display area and comprises a test pad; and the test lead is in the non-display area and is electrically connected with the test pad. The first signal line comprises a first part in the display area, and a second part that is in the non-display area and connected with the first part, the first part extends substantially along the first direction, and the second part is connected with the first part; the first signal line and the test lead are in different layers and insulated from each other, and an orthographic projection of the second part of the first signal line on the base substrate at least partially overlaps with an orthographic projection of the test lead on the base substrate.

At least one embodiment of the present disclosure also provides a display apparatus, comprising any of the display panels provided by the embodiments of the present disclosure.

At least one embodiment of the present disclosure also provides a test method of the display panel, comprising: acquiring a test signal output by the first signal line through the test circuit board to detect whether the scan driver circuit works normally.

For example, in the test method provided by at least an embodiment of the present disclosure, in a case where each pixel row of the plurality of pixel rows comprises a plurality of the first signal lines, the display panel comprises a plurality of the test pads and a plurality of the test leads, each of the plurality of test pads is electrically connected with at least one of the plurality of test leads in the non-display area, and before the display panel is tested, the first signal line and the test lead are arranged in different layers and insulated from each other by an interlayer insulation layer, and an orthographic projection of the second part of the first signal line on the base substrate at least partially overlaps with an orthographic projection of the test lead on the base substrate, the test method further comprises: when each of the plurality of first signal lines is tested, the test lead, the interlayer insulation layer, and the tested first signal line at a preset position are irradiated by laser, and the test lead, the interlayer insulation layer, and the tested first signal line are melted and fused, so that the fused test lead and the first signal line are electrically connected at the preset position, and the preset position is in an overlapping area where the tested first signal line overlaps with the corresponding test lead in a direction perpendicular to the base substrate.

For example, in the test method provided by at least an embodiment of the present disclosure, in a case where each of the plurality of test leads comprises a main lead and a plurality of sub-leads, the main lead comprises a first end connected with each of the test pads and a second end away from the test pads, the plurality of sub-leads are connected with the second end of the main lead, protrude from the second end, and are provided in one-to-one correspondence with the first signal lines. Before the display panel is tested, an orthographic projection of each of the sub-leads on the base substrate at least partially overlaps with the orthographic projection of the second part of the corresponding first signal line on the base substrate, the preset position is in an overlapping area where the orthographic projection of the second part of the tested first signal line overlaps with the orthographic projection of the corresponding sub-lead.

For example, in the test method provided by at least an embodiment of the present disclosure, the laser is incident on the preset position of the display panel from a side of the base substrate away from the first signal line and the test lead; the laser sequentially reaches the base substrate, the first signal line, and the test lead without passing through any conductive layer that is between the first signal line and the base substrate; or, the laser light sequentially reaches the base substrate, the test lead, and the first signal line without passing through any conductive layer that is between the test lead and the base substrate.

For example, the test method provided by at least an embodiment of the present disclosure further comprises: acquiring test signals output by the plurality of first signal lines sequentially to test the plurality of first signal lines sequentially, after the test of a previous one of the first signal lines is completed and before the test of a next one of the first signal lines is performed, the previous one of the first signal lines is cut off to form a break opening at a cut-off position of the previous first signal line, the break opening is in the non-display area; the first signal line that has been tested comprises an unconnected part and a connected part that are separated by the break opening, the unconnected part is disconnected from the corresponding test lead, and the connected part is connected with the corresponding test lead.

For example, in the test method provided by at least an embodiment of the present disclosure, the previous one of the first signal lines is cut by laser.

For example, in the test method provided by at least an embodiment of the present disclosure, the break openings of a plurality of the first signal lines that have been tested are arranged in a second direction perpendicular to the first direction.

BRIEF DESCRIPTION OF THE DRAWINGS

In order to clearly illustrate the technical solution of the embodiments of the disclosure, the drawings of the embodiments will be briefly described in the following; it is apparent that the described drawings are only related to some embodiments of the disclosure and thus are not limitative of the disclosure.

DETAILED DESCRIPTION

Figure 1:
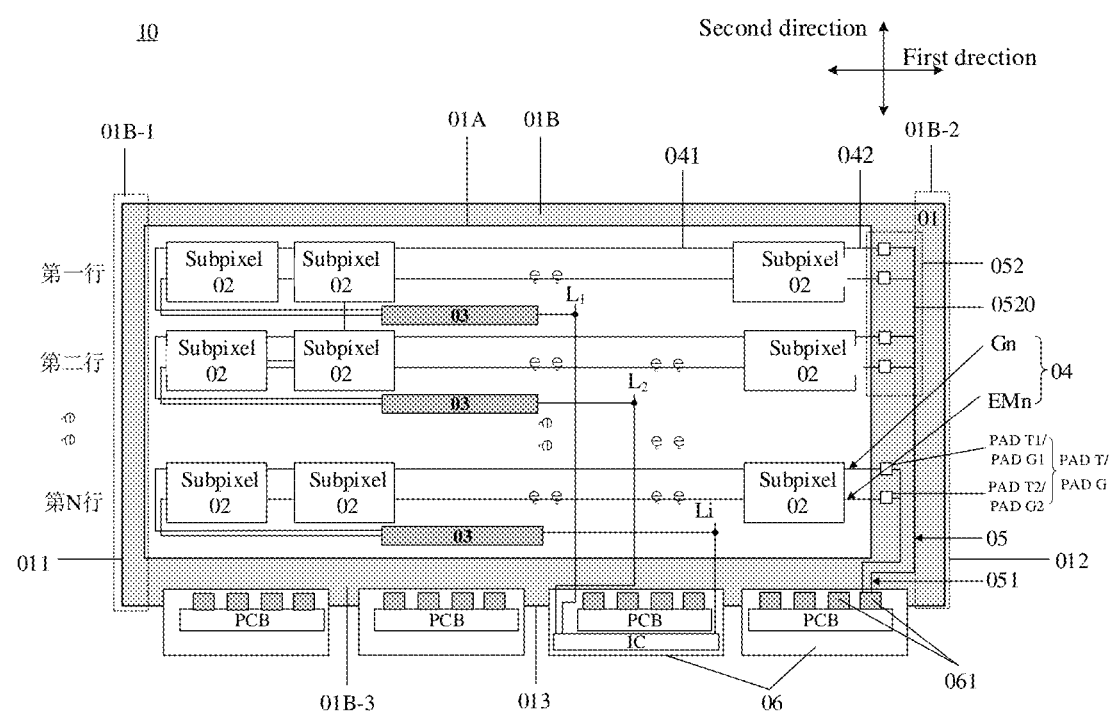
FIG. 1 is a schematic planar view of a display panel provided by at least one embodiment of the present disclosure.

To make the objective, technical solutions and advantages clearer, the technical solutions of the embodiments will be described in a clearly and fully understandable way in connection with the related drawings. The described embodiments are just a part but not all of the embodiments of the present disclosure. Based on the described embodiments herein, a person of ordinary skill in the art can obtain, without any creative work, other embodiment(s) which should be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the present application, are not intended to represent any sequence, amount or importance, but for distinguishing various components. Also, the terms, such as "comprise/comprising," "include/including," or the like are intended to specify that the elements or the objects before these terms encompass the elements or the objects and equivalents thereof listed after these terms, while not preclude other elements or objects. The terms, such as "connect/connecting/connected," or the like, are not limited to a physical connection or mechanical connection, but may include an electrical connection/coupling, directly or indirectly. The terms, "on," "under," "left," "right" or the like are only used to represent relative position relationship, and when the absolute position of the object which is described is changed, the relative position relationship may be changed accordingly.

At least one embodiment of the present disclosure provides a display panel, the display panel comprises a base substrate, a pixel array, a scan driver circuit, a test circuit board, and a test lead. The substrate comprises a display area and a non-display area at least partially surrounding the display area; the pixel array is arranged in the display area on the substrate and comprises a plurality of pixel rows extending in a first direction, each pixel row of the plurality of pixel rows comprises a first signal line and subpixels, and each subpixel comprises a pixel circuit, and the first signal line is configured to provide a scanning signal to the pixel circuit in the pixel row where the first signal line is located; the scan driver circuit is configured to provide the scanning signal to the pixel circuit and comprises a shift register and a clock signal line that are in the display area; the test circuit board is in the non-display area and comprises a test pad; and the test lead is arranged in the non-display area and is electrically connected with the test pad. The first signal line comprises a first part in the display area, and a second part that is in the non-display area and is connected with the first part, the first part extends substantially along the first direction, and the second part is connected with the first part; before the display panel is tested, the first signal line and the test lead are arranged in different layers and insulated from each other; when the display panel is tested, the test lead and the second part of the first signal line are connected to each other, and the test circuit board is configured to acquire a test signal from the first signal line through the test pad and the test lead.

When testing the scan driver circuit (GIA) of the display panel provided by embodiments of the present disclosure, the test circuit board can obtain the test signal on the first signal line that provides the scan signal for the pixel circuit through the test pad, so as to detect whether the scan driver circuit works normally, or not. This scheme has a simple structure, which does not require the test leads and test pads to be directly connected with the scanning drive circuit, such as the shift register or clock signal line of the scanning circuit, but are directly connected with the first signal line of the pixel circuit, thus the structure of the test leads is simplified, space is saved and r the manufacturing difficulty of the test leads is reduced.

FIG. 1 is an overall schematic diagram of the structure of the display panel provided by at least one embodiment of the present disclosure. As shown in FIG. 1, the display panel 10 includes a base substrate 01, a pixel array, a scan driver circuit 03, a test circuit board 06, and a test lead 05. The base substrate 01 includes a display area 01A and a non-display area 01B at least partially surrounding the display area 01A. The pixel array is located in the display area 01A on the base substrate 01, and includes a plurality of pixel rows (i.e., the first row, the second row, . . . the nth row in the figure) extending in the first direction, and each pixel row of the plurality of pixel rows includes a first signal line 04 and subpixels 02. For example, the pixel circuit may include a 2T1C (i.e., two transistors and one capacitor) pixel circuit, 4T2C, 5T1C, 7T1C, or nTmC (n and m are positive integers). For example, in different embodiments, the pixel circuit may further include a compensation sub-circuit, the compensation sub-circuit includes an internal compensation sub-circuit or an external compensation sub-circuit, and the compensation sub-circuit may include a transistor, a capacitor, etc. For example, as required, the pixel circuit may further include a reset circuit, a light-emitting control sub-circuit, a detection circuit, and the like. For example, the display panel 10 is an organic light-emitting diode (OLED) display panel, and the light-emitting elements is an OLED.

The first signal line 04 is configured to provide scanning signals to the pixel circuits in the pixel row where the first signal line 04 is located. At least a part (some) of the subpixels include a light-emitting element and a pixel circuit driving the light-emitting element to emit light. The scanning circuit 03 is configured to provide a scanning signal to the pixel circuit, and includes a shift register and a clock signal line that are located in the display area 01A. The test circuit board 06 is located in the non-display area 01B, and includes a test circuit 060 and a plurality of test pads 061 connected to the test circuit 060, for example, the test circuit board 06 includes a plurality of test pads 061. For example, the test circuit board 06 is a chip on film (COF), and the plurality of test pads 061 are spaced apart from each other in the chip on film. It is to be noted that the test circuit board 06 can be folded on the back side opposite to the display side of the display panel 10. The test lead 05 is located in the non-display area 01B and electrically connected with the test pad 061. Each first signal line 04 includes a first part 041 located in the display area 01A, and a second part 042 that is located in the non-display area 01B and connected with the first part. The first part 041 extends along the first direction substantially, and the second part is connected with the first part. Before the display panel 10 is tested, the first signal line 04 and the test lead 05 are arranged in different layers and insulated from each other. When the display panel 10 is tested, the test lead and the second part of the first signal line are configured to be connected with each other, and the test circuit board is configured to acquire the test signal from the first signal line through the test pad and the test lead. For example, the scan driver circuit is a gate driver circuit.

It is to be noted that the feature "the first part of the first signal line extends along the first direction substantially" refers to that the routing trend of the first part of the first signal line is along the first direction, for example, the first part of the first signal line may be linear extending along the first direction, or the first part of the first signal line has a certain bend or inclination relative to the first direction, but the direction from the start end to the end of the first signal line is along the first direction.

For example, the test lead 05 is directly connected to the first signal line 04. The term "directly connected" here refers to that no or no other circuit structure is arranged between the test lead 05 and the first signal line 04. The circuit structure may be any kind, for example, the circuit structure includes electronic components, such as a thin film transistors and a capacitor, etc.

When the scan driver circuit (GIA) 03 of the display panel provided by the embodiment of the present disclosure is tested, the test circuit board 06 can obtain the test signal on the first signal line 04 that provides the scan signal for the pixel circuit through the test pad 061, so as to detect whether the scan driver circuit 03 works normally, or not. This scheme has a simple structure, which does not require the test leads and test pads to be directly connected with the scanning drive circuit, such as the shift register or clock signal line of the scanning circuit, but directly connected with the first signal line of the pixel circuit, thus the structure of the test leads is simplified, space is saved and the manufacturing difficulty of the test leads is reduced.

The display panel 10 provided by this embodiment is a GIA display panel in which the scan driver circuit 03 is disposed in the display area 01A (gate drive in array, GIA). The connection between the test leads of the display panel and the scan driver circuit provided in the embodiment of the present disclosure is different from the display panel adopting a GOA (Gate on array). In the display panel using the GOA, the test lead used to test whether the scan driver circuit works normally, or not, is directly connected to the scan driver circuit. In the display panel 10 provided by the embodiment of the present disclosure, the test lead 05 is directly connected with the first signal line 04, and no other circuit structure exists or connected between the test lead 05 and the first signal line 04. However, in a GOA display panel, the test pads are connected with the test leads, the test leads are connected with signal lines of GOA scan driver circuit, such as signal lines connected with the input terminal of the shift register of the GOA scan driver circuit, to obtain signals of these signal lines. These signal lines connected with the input terminal of the shift register include clock signal lines, etc., and the shift register and these signal lines connected with the input terminal of the shift register are all located in the non-display area, and does not extend from the display area to the non-display area, and in this case, at least a GOA scan driver circuit is connected between the test lead and the pixel circuit.

Figure 2:
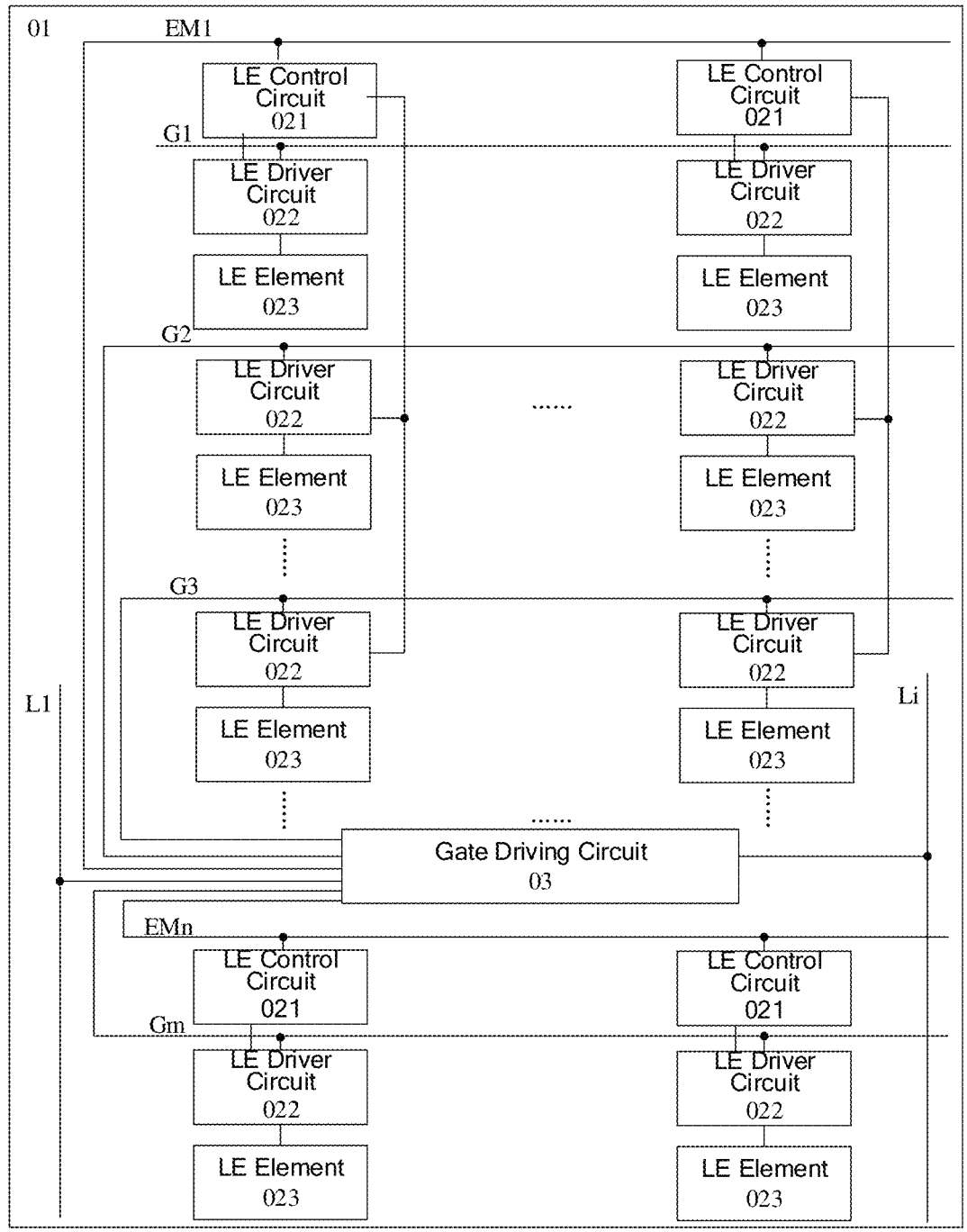
FIG. 2 is a schematic diagram of an arrangement mode of a pixel circuit and a scan driver circuit of a display panel provided by at least one embodiment of the present disclosure.
Figure 3:
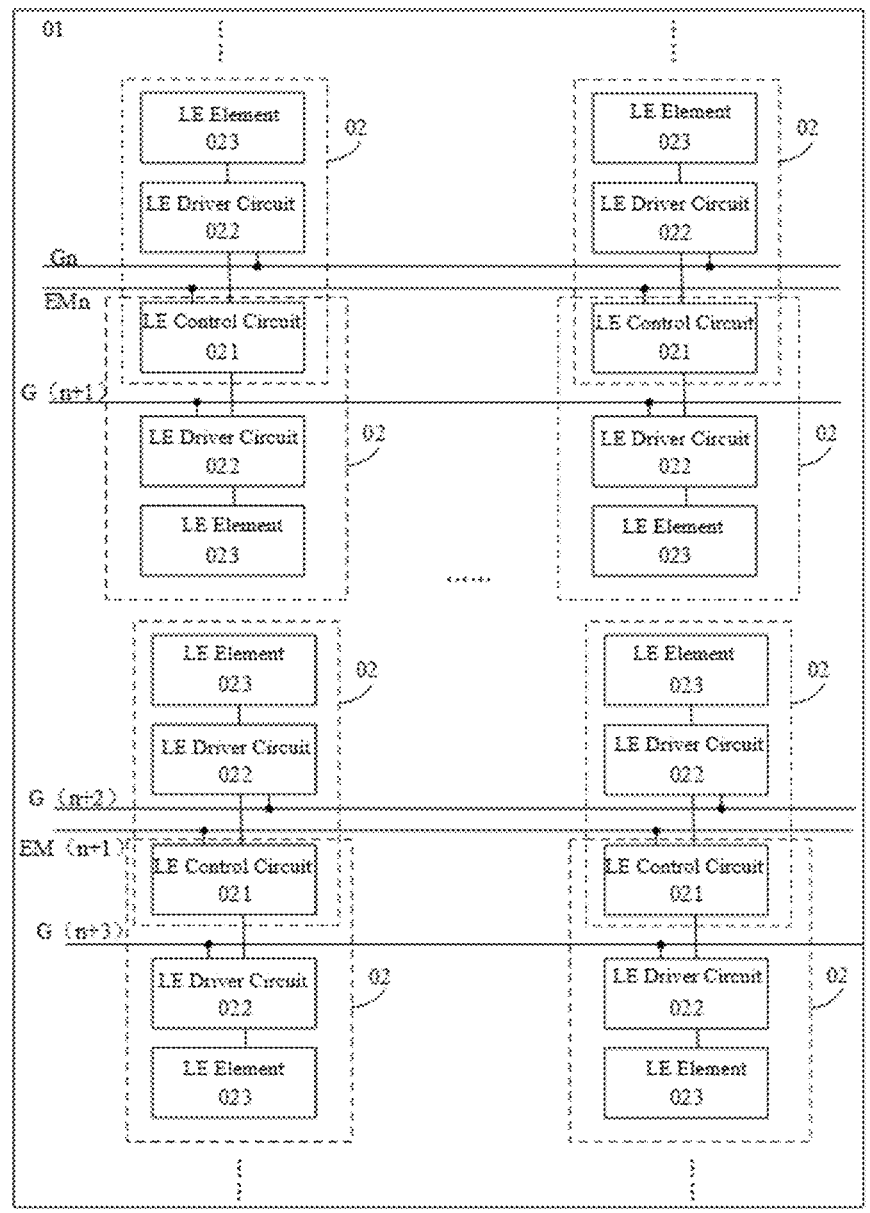
FIG. 3 is a schematic diagram of the arrangement of the pixel circuit and the gate lines of the scan driver circuit of the display panel shown in FIG. 2.

FIG. 2 is a schematic diagram of the arrangement of the pixel circuit and the scan driver circuit of the display panel provided by at least one embodiment of the present disclosure, and FIG. 3 is a schematic diagram of the arrangement of the pixel circuit of the display panel and the gate line of the scan driver circuit shown in FIG. 2. As shown in FIGS. 1-3, each pixel 02 may include a light-emitting (LE) control circuit 021, a light-emitting (LE) driver circuit 022, and a light-emitting (LE) element 023.

For example, the first signal line 04 is a gate line, the gate line includes, for example, a scanning line, a reset control line, and a light-emitting control line. Here, the gate line refers to a signal line directly connected with the gate of a transistor to provide a scanning signal or a control signal. For example, as shown in FIGS. 2-3, the display panel 10 includes a plurality of first signal lines 04, the plurality of first signal lines 04 includes a plurality of light-emitting control lines EM1~EMn, and a plurality of scanning lines G1~Gm. For example, the display panel 10 further includes a plurality of driver signal lines, such as L1~Li as shown in FIG. 2.

The input terminal of the scan driver circuit 03 is connected to the plurality of driver signal lines L1 to Li, and the output terminal of the scan driver circuit 03 is connected to the plurality of light-emitting control lines EM1~EMn and the plurality of scanning lines G1-Gm. The plurality of light-emitting control lines EM1 to EMn may be connected to the light-emitting control circuit 021 included in each subpixel 02 in the corresponding pixel row, and the plurality of scanning lines G1~Gm may be connected to the light-emitting driver circuit 022 included in each subpixel 02 in the corresponding pixel row. The scanning circuit 03 may be configured to output light-emitting control signals to the plurality of light-emitting control lines and output gate drive signals to the plurality of gate lines in response to the driver signals provided by the plurality of driver signal lines. That is, the scan driver circuit 03 can work being driven by the driver signals provided by the plurality of driver signal lines L1~Li.

For example, the plurality of rows of subpixels 02 may be correspondingly connected with the plurality of first signal lines 04. For example, in the display panel provided by at least one embodiment of the present disclosure, each row of subpixels 02 is correspondingly connected with one scanning line, two reset control lines and one light-emitting control line, the two reset control lines are respectively the first reset control line and the second reset control line. That is, in a plurality of subpixels 02 located in one same row, the light-emitting control circuit 021 included in the pixel circuit of each subpixel 02 may be connected to one same light-emitting control line, and the light-emitting driver circuit 022 included in each subpixel 02 may be connected to one same scanning line. For example, in at least one embodiment of the present disclosure, the number of the scanning lines included in the display panel 10 is the same as the number of the rows of pixels.

For example, as shown in FIGS. 2-3, at least two pixels 02 may share the same one light-emitting control circuit 021, that is, at least two pixels 02 may work being driven by the same one light-emitting control circuit 021. Because at least two subpixels 02 can share the same one light-emitting control circuit 021, if the at least two subpixels 02 are located in one same row, the number of the light-emitting control circuits 021 to be provided can be correspondingly reduced. If the at least two subpixels 02 are located in one same column, not only the number of the light-emitting control circuits 021 but also the number of the light-emitting control lines to be provided can be correspondingly reduced. In this way, the effect of optimizing the pixel space can be achieved without affecting the normal display of the subpixel 02, that is, the area occupied by the subpixels 02 on the base substrate 01 can be reduced compared with the related technology. Furthermore, the area of the remaining space on the base substrate 01 is increased, and the remaining space can be used to reliably arrange the scan driver circuit 03 and the driver signal lines to be connected with the scan driver circuit 03. Therefore, the display panel 10 shown in FIGS. 2-3, in which the scan driver circuit 03 is arranged in the pixel array in the display area (gate drive in array, GIA), i.e., the GIA display panel, is obtained.

In addition, with continued reference to FIG. 2, in each subpixel 02, the light-emitting control circuit 021 may be connected with the light-emitting driver circuit 022, the light-emitting driver circuit 022 may be connected with the light-emitting element 023. The light-emitting control circuit 021 may be configured to output a DC power signal to the connected light-emitting drive circuit 022 in response to the light-emitting control signal provided by the connected light-emitting control line. The light-emitting circuit 022 can be used to output a driver signal to the connected light-emitting element 023 in response to the gate driver signal provided by the connected gate line and the received DC power signal, so as to drive the light-emitting element 023 to emit light.

In the display panel provided by the disclosed embodiment, at least two pixels located on the base substrate 01 can share one same light-emitting control circuit connected with the light-emitting control line, so the number of the light-emitting control circuits required to be provided in the display panel can be reduced, or the number of the light-emitting control lines required to be provided on the display panel can be further reduced, that is, finally, the area of the substrate to be occupied by each pixel can be reduced. Furthermore, the scan driver circuit that provides signals to the signal lines connected to the pixels, and the driver signals connected to the scan driver circuit can both be arranged on the substrate. Thus, the resolution of the display panel provided by the embodiments of the present disclosure is high.

For example, as shown in FIG. 2, in the display panel 10 provided by the embodiments of the present disclosure, the at least two subpixels 02 sharing the same one light-emitting control circuit 021 may be located in one same column. In this way, in connection with the description of the above embodiment, compared with the related art, it is possible to reduce not only the number of the light-emitting control circuits 021 required to be provided on the base substrate 01, but also the number of the light-emitting control lines required to be provided on the base substrate 01.

For example, suppose that the display panel includes m rows of subpixels 02, if the at least two subpixels 02 located in one same column share the same one light-emitting control circuit 021, the number of the light-emitting control lines provided on the base substrate 01 is less than number of the rows of subpixels 02. That is, in FIG. 2, n is less than m, both m and n are integers greater than 1.

For example, the at least two subpixels 02 sharing the same one light-emitting control circuit 021 are not only located in the same column, but also may be adjacent to each other, which can facilitate the layout and signal routing.

For example, FIG. 3 illustrates another display panel by using the case that every two adjacent subpixels 02 in the same column share the same one light-emitting control circuit 021 as an example. Furthermore, FIG. 3 only schematically shows that the adjacent nth row of subpixels 02 and the (n+1)th row of subpixels 02 share the same one light-emitting control circuit 021, and the adjacent (n+2)th row of subpixels 02 and the (n+3)th row of subpixel 02 share the same one light-emitting control circuit 021. It can be further seen from FIG. 3 that in the case where the two subpixels 02 share the same one light-emitting control circuit 021 are located in the same one column, the two adjacent subpixels 02 can also share the same one light-emitting control line (for example, EMn and EM(n+1)).

Figure 4A:
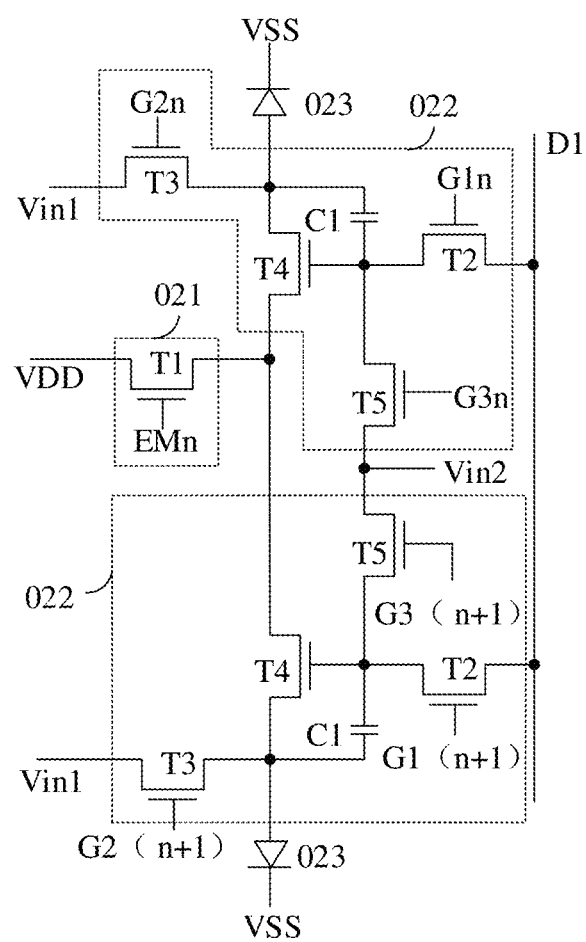
FIG. 4A is an equivalent circuit diagram of the pixel circuit of two adjacent subpixels in a display panel provided by an embodiment of the present disclosure.
Figure 4B:
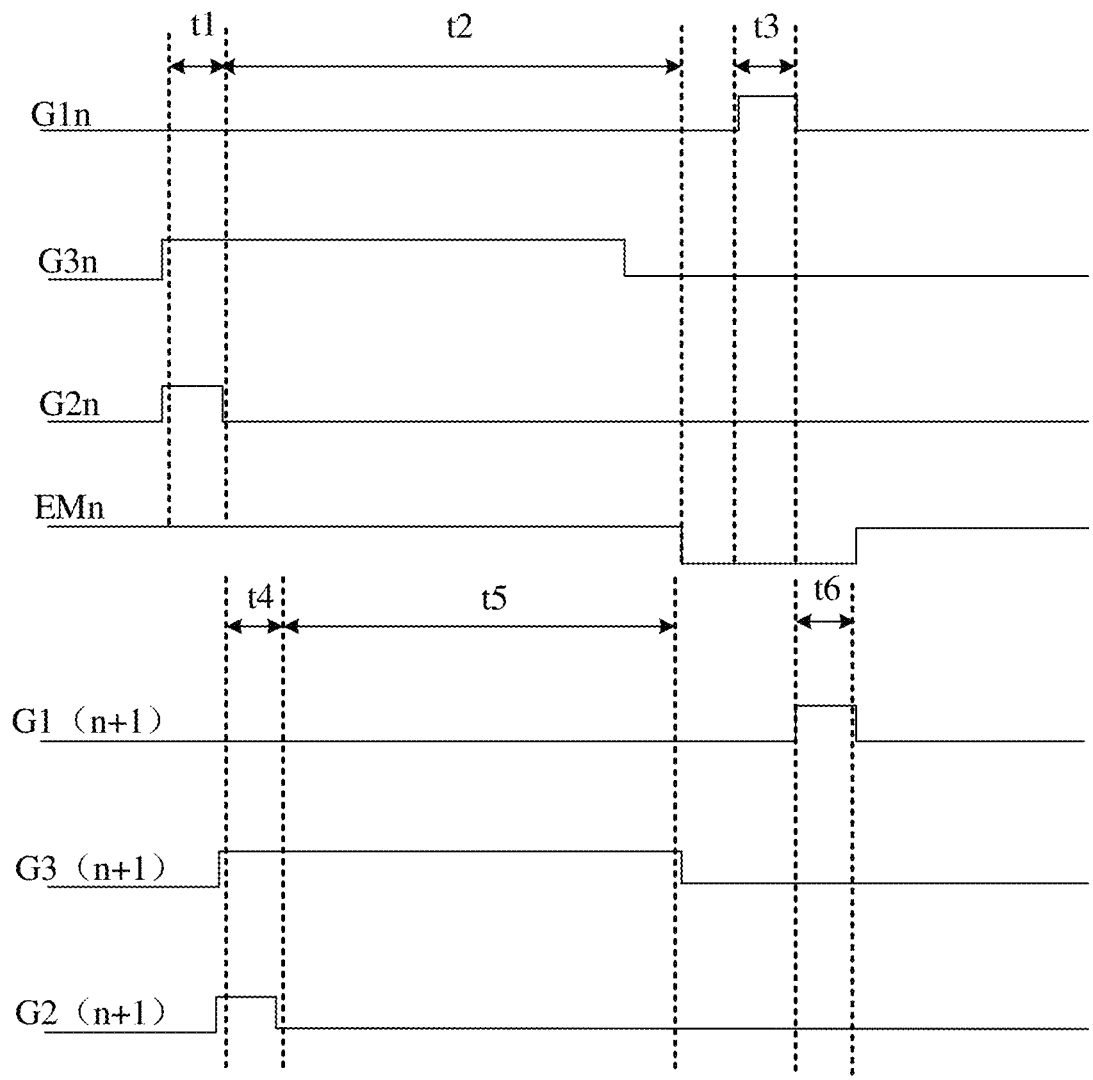
FIG. 4B is an operation timing diagram of the pixel circuit shown in FIG. 4A provided by an embodiment of the present disclosure.
Figure 5A:
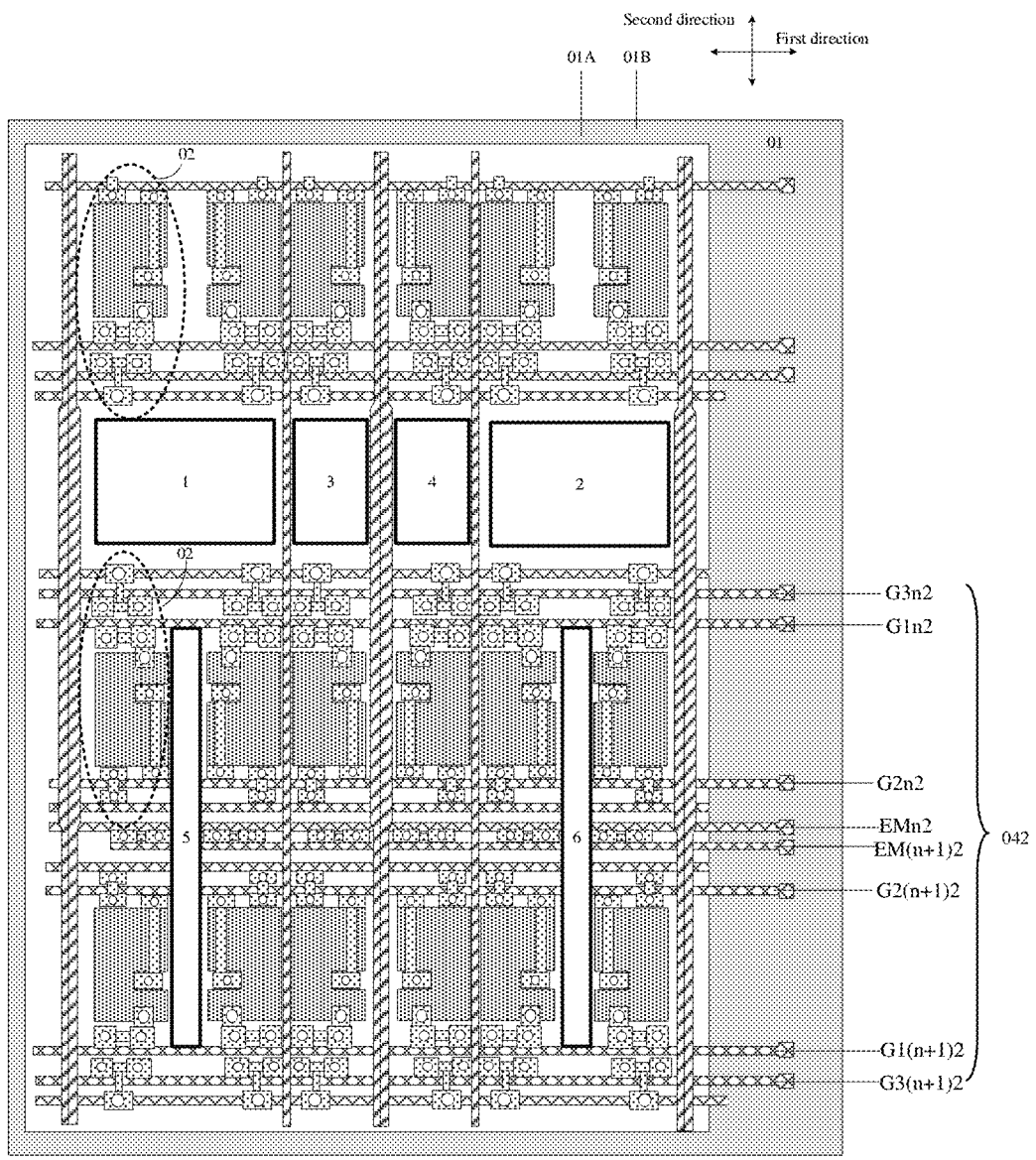
FIG. 5A is a schematic diagram of a pixel structure of a display panel provided by an embodiment of the present disclosure.
Figure 5B:
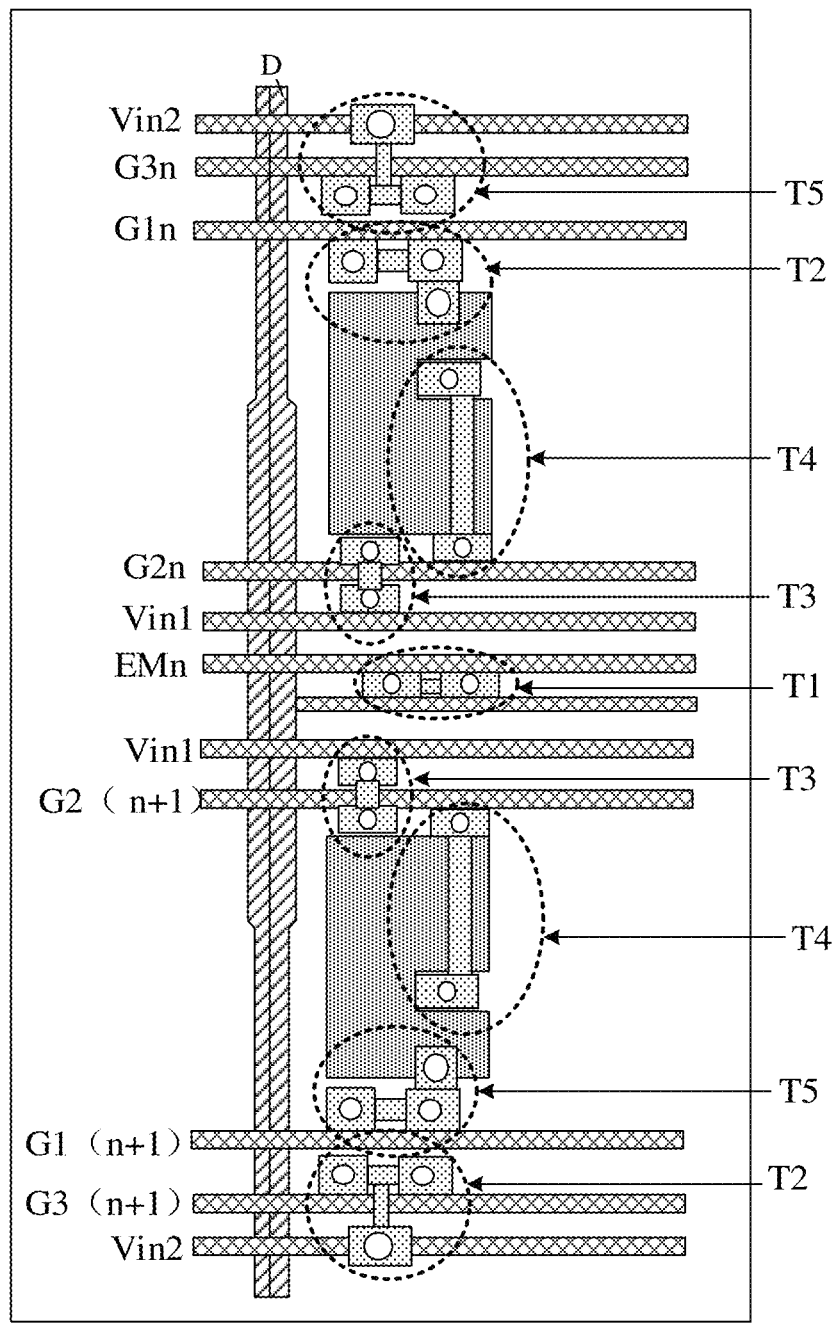
FIG. 5B is a structural diagram of two adjacent subpixels of the display panel shown in FIG. 5A.

FIG. 4A is an equivalent circuit diagram of the pixel circuit of two adjacent subpixels in a display panel provided by an embodiment of the present disclosure, FIG. 4B is an operation timing diagram of the pixel circuit shown in FIG. 4A provided by an embodiment of the present disclosure, FIG. 5A is a schematic diagram of a pixel structure of a display panel provided by an embodiment of the present disclosure, and FIG. 5B is a structural diagram of two adjacent subpixels of the display panel shown in FIG. 5A. It is to be noted that in FIG. 5A, in order to clearly show the part of the display panel 10 including the first signal line and the pixel circuit, the structures, such as the test leads and the test pads, are omitted in FIG. 5A, and the positions of the omitted structures, such as the test leads and the test pads are the same as those in FIG. 1.

With reference to FIG. 3, FIG. 4A, and FIGS. 5A-5B, the nth row of subpixels 02 and the (n+1)th row of subpixels 02 located in the first column and adjacent to each other are illustrated as an example. Two subpixels 02 sharing the same one light-emitting control circuit 021 may be symmetrically arranged on two sides of the light-emitting control line EMn connected with the light-emitting control circuit 021 that is shared by the two subpixels 02. That is, for the two subpixels 02, the transistors and connected signal lines included in one subpixel 02 and the transistors and connected signal lines included in another subpixel 02 can be symmetrically arranged on two sides of the light-emitting control line EMn. With this design, the layout and signal routing can be further facilitated, and the signal lines can be centrally arranged, which further optimize the pixel space.

With reference to FIGS. 4A and 5B, in the embodiment of the present disclosure, in order to reliably drive the light-emitting element 023 included in the subpixel 02 to emit light, the display panel 10 may further include a plurality of data lines located on the base substrate 01. The plurality of scanning lines may include a plurality of first scanning lines, a plurality of second scanning lines, and a plurality of third scanning lines.

The number of data lines may be the same as the number of the pixel columns, and the number of first scanning lines, the number of second scanning lines, and the number of third scanning lines may respectively be the same as the number of pixel rows. FIGS. 4A and 5B show only one data line D1, two first scanning lines Gin and G1(n+1), two second scanning lines G2n and G2(n+1), and two third scanning lines G3n and G3(n+1).

With continued reference to FIGS. 4A and 5B, in each subpixel 02, the light-emitting control circuit 021 may include a light-emitting control transistor T1. The light-emitting drive circuit may include a data writing transistor T2, a reset transistor T3, a driving transistor T4, a compensation transistor T5, and a storage capacitor Cst. The writing transistor T2 is configured to transmit a data signal to the driving transistor under the control of the scanning signal, and the driving transistor T4 is configured to control the magnitude of the driving current flowing through the light-emitting element 023 according to the data signal.

The gate of the writing transistor T2 may be connected to a first scanning line, the first electrode of the writing transistor T2 may be connected to the gate of the driving transistor T4, and the second electrode of the writing transistor T2 may be connected to a data line D1. The gate of the data writing transistor T2 in the nth row subpixel 02 is connected to the first scanning line Gin, and the gate of the data writing transistor T2 in the (n+1)th row subpixel 02 is connected to the first scanning line G1(n+1).

The first electrode of the driving transistor T4 may be connected to the first electrode of the light-emitting control transistor T1, and the second electrode of the driving transistor T4 may be connected to the light-emitting element 023, which may also be connected to the first power supply terminal VSS.

The gate of the light-emitting control transistor T1 may be connected to one light-emitting control line EMn, and the second electrode of the light-emitting control transistor T1 may be connected to the second power supply terminal VDD.

The gate of the reset transistor T3 may be connected to a second scanning line, the first electrode may be connected to the first initial signal terminal Vin1, and the second electrode may be connected to the second electrode of the driving transistor T4. The gate of the reset transistor T3 in the nth row subpixel 02 is connected to the second scanning line G2n, and the gate of the reset transistor T3 in the nth+1th row subpixel 02 is connected to the second scanning line G2(n+1).

The gate of the compensation transistor T5 may be connected to a third scanning line, the first electrode may be connected to the second initial signal terminal Vin2, and the second electrode may be connected to the gate of the driving transistor T4. The gate of the compensation transistor T5 in the nth row subpixel 02 is connected to the third scanning line G3n, and the gate of the compensation transistor T5 in the nth+1th row subpixel 02 is connected to the third scanning line G3 (n+1).

It is to be noted that the above only schematically shows an alternative structure of a subpixel 02, which is a 5T1C (i.e., five transistors and one capacitor) structure. The embodiment of the present disclosure is not limited to the above structure of the subpixel 02, but it may also have other structures, such as 7T1C structure.

In the following embodiments, the optional structure of the display substrate is illustrated by using the case where every two adjacent subpixels 02 in the same one column share the same one light-emitting control circuit 021 as an example. In other embodiments of the present disclosure, two adjacent subpixels 02 may not share the same one light-emitting control circuit 021, and the pixel circuit of each subpixel includes one light-emitting control circuit 021, which is not limited by the present disclosure.

For example, in the embodiment of the present disclosure, each drive signal line Li connected to the scan driver circuit 03 may be located between two adjacent columns of subpixels 02. For example, referring to FIG. 6, another display substrate is shown, because every two adjacent subpixels 02 located in the same one column and share the same one light-emitting control circuit 021, additional areas can be reserved between every two adjacent subpixels 02, such as the area 5 and the area 6 shown in FIG. 6. Accordingly, the drive signal line Li to which the scan driver circuit 03 is connected may be provided in the area 5 and the area 6.

Because the area between every two adjacent columns of subpixels 02 is limited, in order to ensure the reliable arrangement of driver signal lines, at most two driver signal lines may be provided between every two adjacent columns of subpixels 02.

In the embodiment of the present disclosure, the scan driver circuit 03 may include a plurality of shift register units 031 in cascade. At least two cascaded shift register units 031 may be located between two adjacent rows of subpixels 02. For example, a gap area is provided between adjacent pixel rows of the plurality of pixel rows, and the shift register and the clock signal line are located in the gap area.

For example, with reference to FIG. 5A, because each two adjacent subpixels 02 are located in the same one column and share the same one light-emitting control circuit 021, additional areas can be reserved between each two adjacent subpixels 02, such as the area 1, the area 2, the area 3, and the area 4 shown in FIG. 6. Accordingly, at least two cascaded shift register units 031 may be arranged in the area 1~4 between every two adjacent rows of subpixels 02.

Furthermore, in order to facilitate signal routing, in combination with FIG. 5A, at least two cascaded shift register units 031 may be located between two adjacent rows of target subpixels 02. For the two rows of target subpixels 02, the light-emitting control circuit connected to one row of target subpixels 02 is different from the light-emitting control circuit connected to another row of target subpixels 02. That is, at least two cascaded shift register units 031 may be located between two rows of subpixels 02 that do not share the light-emitting control circuit 021.

Figure 6A:
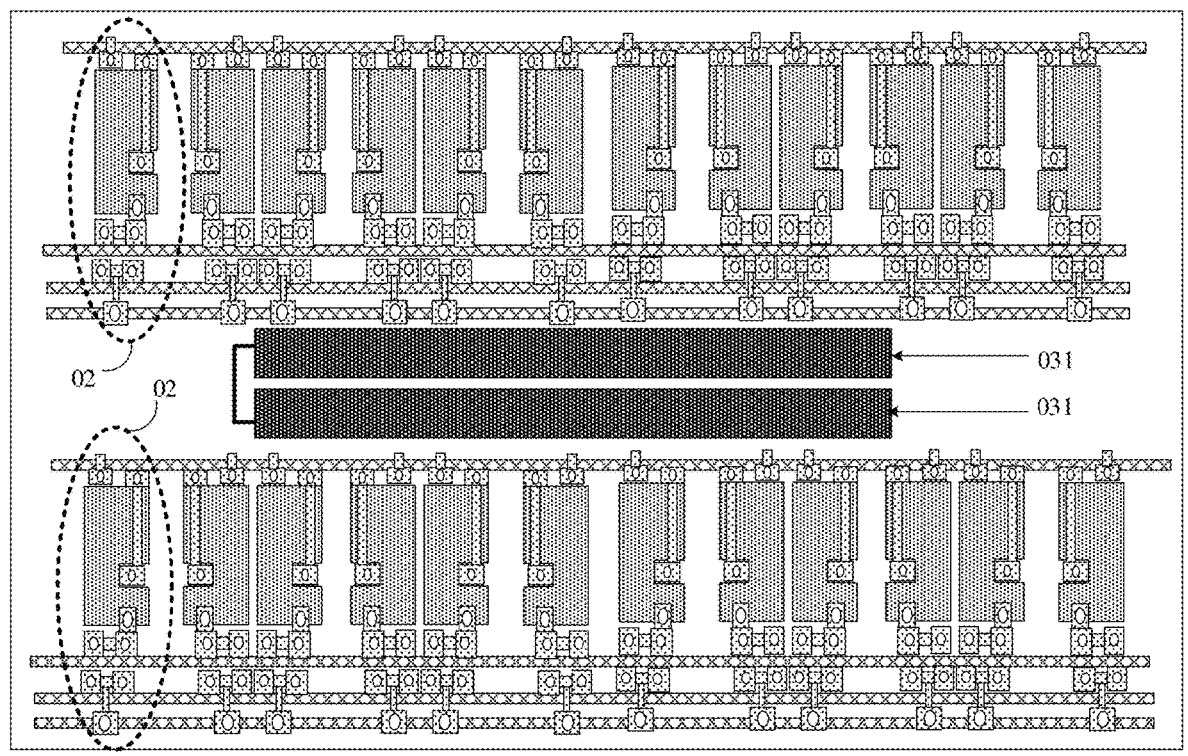
FIG. 6A is a schematically structural diagram of a display panel showing a shift register unit provided by an embodiment of the present disclosure.

For example, FIG. 6A is a schematically structural diagram of another display substrate provided by an embodiment of the present disclosure. As shown in FIG. 6A, only two cascaded shift register units 031 may be provided between every two adjacent rows of target subpixels 02. For the two cascaded shift register units, one shift register unit 031 may be connected to one row of target subpixels 02, and the other shift register unit 031 may be connected to another row of target subpixels 02 (not shown in FIG. 6A).

For example, the two cascaded shift register units 031 can be symmetrically arranged between the two rows of target pixels. That is, the transistors included in one shift register unit 031 are symmetrically arranged with the transistors included in the other shift register unit 031. In this way, some driver signal lines (e.g., power signals providing DC signals) can be shared, the space of the GIA display panel is further optimized, that is, the area of the base substrate 01 occupied by the shift register unit 031 is decreased.

Figure 6B:
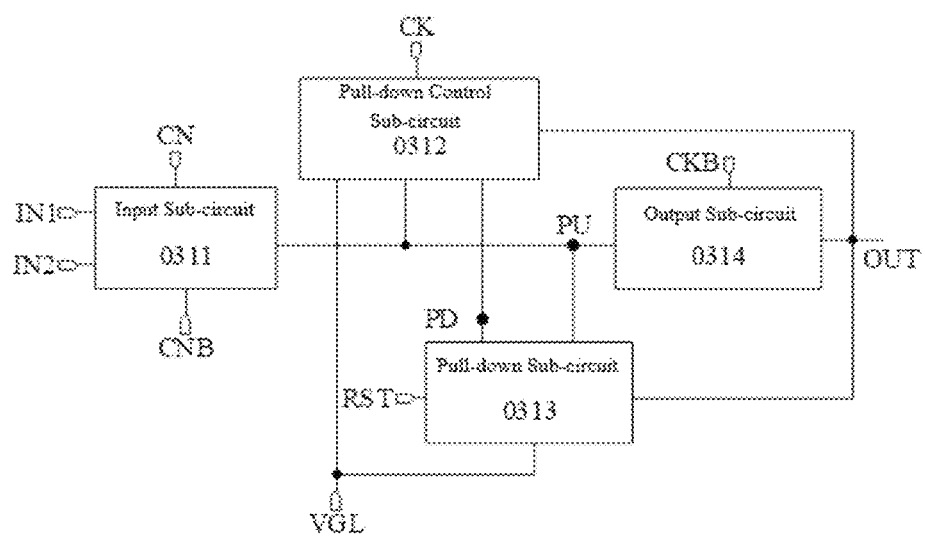
FIG. 6B is a schematically structural diagram of a shift register unit provided by an embodiment of the present disclosure.

FIG. 6B is a schematically structural diagram of a shift register unit provided by an embodiment of the present disclosure. As shown in FIG. 6B, the shift register unit 031 may include an input sub-circuit 0311, a pull-down control sub-circuit 0312, a pull-down sub-circuit 0313 and an output sub-circuit 0314.

The input sub-circuit 0311 may be respectively connected to the first input terminal IN1, the second input terminal IN2, the first control signal terminal CN, the second control signal terminal CNB, and the pull-up node PU. The input sub-circuit 0311 may be configured to output the first control signal provided by the first control signal terminal CN to the pull-up node PU in response to the first input signal provided by the first input terminal IN1, and is configured to output the second control signal provided by the second control signal terminal CNB to the pull-up node PU in response to the second input signal provided by the second input terminal IN2.

For example, the input sub-circuit 0311 may output the first control signal provided by the first control signal terminal CN to the pull-up node PU when the potential of the first input signal provided by the first input terminal IN1 is the first potential, and, when the potential of the second input signal provided by the second input terminal IN2 is the first potential, the input sub-circuit 0311 may output the second control signal provided by the second control signal terminal CNB to the pull-up node PU.

For example, the first input terminal IN1 may be connected to the output terminal of the shift register unit 031 at the previous stage, and the second input terminal IN2 may be connected to the output terminal of the shift register unit 031 at the next stage. The potential of the first control signal and the potential of the second control signal may be complementary. That is, when the potential of the first control signal is the first potential, the potential of the second control signal is the second potential; and when the potential of the first control signal is the second potential, the potential of the second control signal is the first potential. The first potential may be an effective potential and the second potential may be an ineffective potential. In the case where the transistor is an N-type transistor, the first potential may be a high potential relative to the second potential; in the case the transistor is a P-type transistor, the first potential may be a low potential relative to the second potential.

The pull-down control sub-circuit 0312 may be respectively connected to the first clock signal terminal CK, the pull-up node PU, the pull-down power supply terminal VGL, the pull-down node PD, and the output terminal OUT. The pull-down control sub-circuit 0312 may be configured to output the first clock signal to the pull-down node PD in response to the first clock signal provided by the first clock signal terminal CK, and configured to output the pull-down power signal provided by the pull-down power terminal VGL to the pull-down node PD in response to the potential of the pull-up node PU and the output signal provided by the output terminal OUT.

For example, the pull-down control sub-circuit 0312 may output the first clock signal to the pull-down node PD in the case where the potential of the first clock signal provided by the first clock signal terminal CK is the first potential, so as to charge the pull-down node PD. The pull-down control sub-circuit 0312 may output the pull-down power signal provided by the pull-down power supply terminal VGL to the pull-down node PD in the case where the potential of the pull-up node PU is the first potential, and the potential of the pull-down power signal may be the second potential, so as to reduce the noise of the pull-down node PD. And, the pull-down control sub-circuit 0312 may output the pull-down power signal to the pull-down node PD in the case where the potential of the output signal provided by the output terminal OUT is the first potential, so as to reduce the noise of the pull-down node PD.

The pull-down circuit 0313 can be respectively connected to the reset signal terminal RST, the pull-down node PD, the pull-down power supply terminal VGL, the pull-up node PU, and the output terminal OUT. The pull-down sub-circuit 0313 may be configured to output a pull-down power signal to the pull-up node PU and the output terminal OUT in response to the potential of the pull-down node PD, and to output a pull-down power signal to the pull-up node PU in response to the reset signal provided by the reset signal terminal RST.

For example, the pull-down sub-circuit 0313 may output a pull-down power signal to the pull-up node PU and the output terminal OUT in the case where the potential of the pull-down node PD is the first potential, so as to reduce the noise of the pull-up node PU and the output terminal OUT. And, in the case where the potential of the reset signal provided by the reset signal terminal RST is the first potential, the pull-down sub-circuit 0313 may be configured to output the pull-down power signal to the pull-up node PU, so as to reduce the noise of the pull-up node PU.

The output sub-circuit 0314 may be respectively connected to the pull-up node PU, the second clock signal terminal CKB, and the output terminal OUT. The output sub-circuit 0314 mat be configured to output the second clock signal provided by the second clock signal terminal CKB to the output terminal OUT in response to the potential of the pull-up node PU.

For example, the output sub-circuit 0314 may output the second clock signal provided by the second clock signal terminal CKB to the output terminal OUT in the case where the potential of the pull-up node PU is the first potential. The second clock signal may be provided to the gate line as a gate driver signal, or, may be provided to the light-emitting control line as a light-emitting control signal.

Figure 6C:
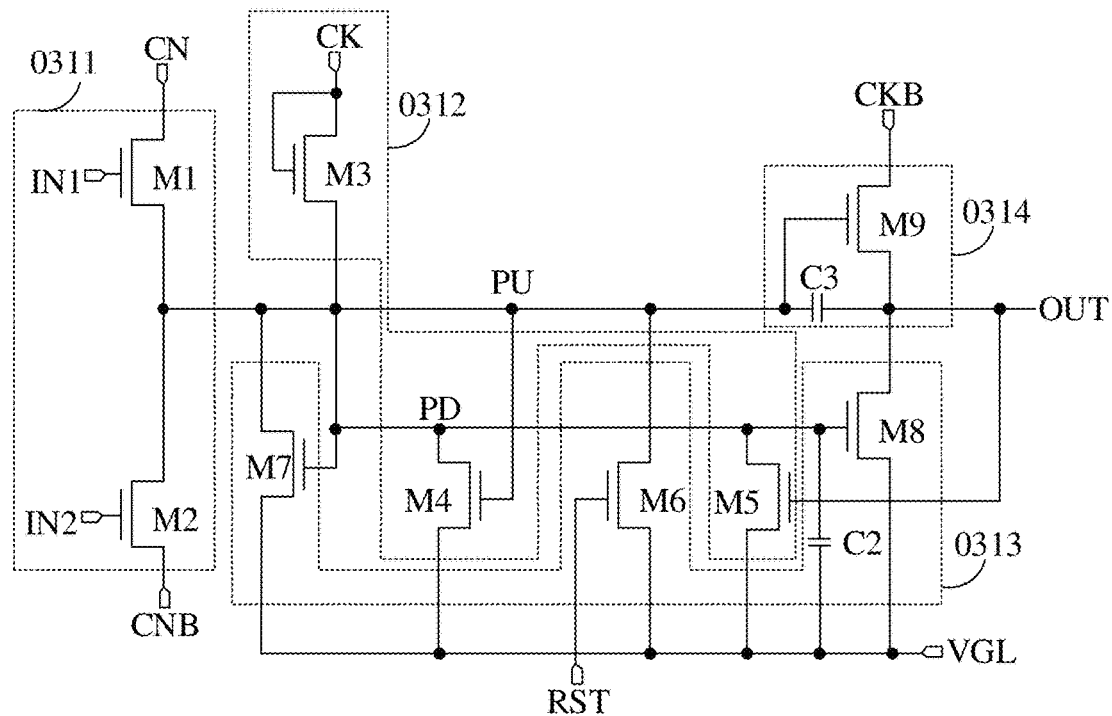
FIG. 6C is a schematically structural diagram of another shift register unit provided by an embodiment of the present disclosure.

FIG. 6C is a schematically structural diagram of another shift register unit provided by an embodiment of the present disclosure. As shown in FIG. 6C, the input sub-circuit 0311 may include a first input transistor M1 and a second input transistor M2. The pull-down control sub-circuit 0312 may include a first pull-down control transistor M3, a second pull-down control transistor M4, and a third pull-down control transistor M5. The pull-down circuit 0313 may include a first pull-down transistor M6, a second pull-down transistor M7, a third pull-down transistor M8, and a pull-down capacitor C2. The output sub-circuit 0314 may include an output transistor M9 and an output capacitor C3.

The gate of the first input transistor M1 may be connected to the first input terminal IN1, the first electrode may be connected to the first control signal terminal CN, and the second electrode may be connected to the pull-up node PU. Accordingly, in the case where the potential of the first input signal provided by the first input terminal IN1 is the first potential, the first input transistor M1 outputs the first control signal provided by the first control signal terminal CN to the pull-up node PU, so as to charge the pull-up node PU.

The gate of the second input transistor M2 may be connected to the second input terminal IN2, the first electrode of the second input transistor M2 may be connected to the second control signal terminal CNB, and the second electrode of the second input transistor M2 may be connected to the pull-up node PU. Accordingly, in the case where the potential of the second input signal provided by the second input terminal IN2 is the first potential, the second input transistor M2 may output the second control signal provided by the second control signal terminal CNB to the pull-up node PU, so as to reset the pull-up node PU.

The gate and the first electrode of the first pull-down control transistor M3 may both be connected to the first clock signal terminal CK, and the second electrode of the first pull-down control transistor M3 may be connected to the pull-down node PD. Accordingly, the first pull-down control transistor M3 may output the first clock signal to the pull-down node PD in the case where the potential of the first clock signal provided by the first clock signal terminal CK is the first potential, so as to charge the pull-down node PD.

The gate of the second pull-down control transistor M4 may be connected to the pull-up node PU, the first electrode of the second pull-down control transistor M4 may be connected to the pull-down power supply terminal VGL, and the second electrode of the second pull-down control transistor M4 may be connected to the pull-down node PD. Accordingly, the second pull-down control transistor M4 can output a pull-down power signal to the pull-down node PD in the case where the potential of the pull-up node PU is the first potential, so as to reduce the noise of the pull-down node PD.

The gate of the third pull-down control transistor M5 may be connected to the output terminal OUT, the first electrode of the third pull-down control transistor M5 may be connected to the pull-down power supply terminal VGL, and the second electrode of the third pull-down control transistor M5 may be connected to the pull-down node PD. Accordingly, the third pull-down control transistor M5 can output a pull-down power signal to the pull-down node PD in the case where the potential of the output signal provided by the output terminal OUT is the first potential, so as to reduce the noise of the pull-down node PD.

The gate of the first pull-down transistor M6 may be connected to the reset signal terminal RST, the first electrode of the first pull-down transistor M6 may be connected to the pull-down power supply terminal VGL, and the second electrode of the first pull-down transistor M6 may be connected to the pull-up node PU. Accordingly, the first pull-down transistor M6 can output the pull-down power signal provided by the pull-down power supply terminal VGL to the pull-up node PU in the case where the potential of the reset signal provided by the reset signal terminal RST is the first potential, so as to reduce the noise of the pull-up node PU.

The gate of the second pull-down transistor M7 and the gate of the third pull-down transistor M8 can be connected to the pull-down node PD, the first electrode of the second pull-down transistor M7 and the first electrode of the third pull-down transistor M8 can be connected to the pull-down power supply terminal VGL, the second electrode of the second pull-down transistor M7 can be connected to the pull-up node PU, and the second electrode of the third pull-down transistor M8 can be connected to the output terminal OUT. Accordingly, the second pull-down transistor M7 can output a pull-down power signal to the pull-up node PU when the potential of the pull-down node PD is the first potential, so as to reduce the noise of the pull-up node PU. The third pull-down transistor M8 can output a pull-down power signal to the output terminal OUT when the potential of the pull-down node PD is the first potential, so as to reduce the noise of the output terminal OUT.

One end of the pull-down capacitor C2 may be connected to the pull-down node PD, and the other end of the pull-down capacitor C2 may be connected to the pull-down power supply terminal VGL. The pull-down capacitor C2 can be used to keep the potential of the pull-down node PD.

One end of the output capacitor C3 may be connected to the pull-up node PU, and the other end of the output capacitor C3 may be connected to the output terminal OUT. The output capacitor C3 can be used to keep the potential of the pull-up node PU.

The gate of the output transistor M9 may be connected to the pull-up node PU, the first electrode of the output transistor M9 may be connected to the second clock signal terminal CKB, and the second electrode of the output transistor M9 may be connected to the output terminal OUT.

Accordingly, for the scan driver circuit 03 including the shift register unit 031 shown in FIGS. 6A and 6B, the driver signal lines connected to the scan driver circuit 03 include the signal line connected to the first control signal terminal CN, the signal line connected to the second control signal terminal CNB, the signal line connected to the reset signal terminal RST, the signal line connected to the first clock signal terminal CK, the signal line connected to the second clock signal terminal CKB and the signal line connected to the pull-down power supply terminal VGL. In this way, in the case where the two shift register units 031 are symmetrically arranged between the two rows of target subpixels 02, the two shift register units 031 can share the same one signal line connected to the pull-down power supply terminal VGL.

Figure 6D:
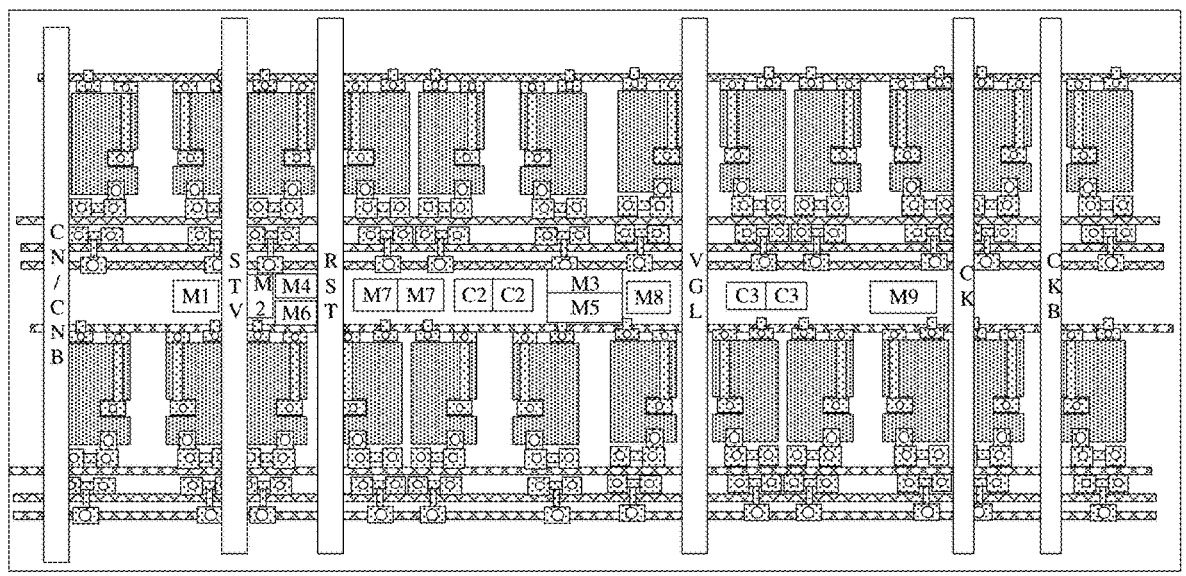
FIG. 6D is a schematically structural diagram of a display panel showing a scan driver circuit provided by an embodiment of the present disclosure.

Combined with FIG. 6D, the shift register unit 031 shown in FIG. 6B is illustrated as an example, FIG. 6D shows the circuit structure of the shift register unit 031 between two adjacent rows of subpixels 02 and the optional arranging positions of the driver signal lines. As can be seen from FIGS. 6 to 6C, during layout, the transistors with relatively large sizes in the shift register unit 031 may be arranged in the area 1 and the area 2 that have relatively large areas, and the transistors with a relatively small size in the shift register unit 031 may be arranged in the area 3 and the area 4 that have a relatively small area. In addition, referring to FIG. 6D again, it is also possible to connect two transistors in series to form one transistor (e.g., two transistors M7 shown in FIG. 6D) or connect two capacitors in series to form one capacitor (e.g., two capacitors C2 and two capacitors C3 shown in FIG. 6D), so that all the transistors in the shift register unit 031 can be reliably arranged in the limited space of the base substrate 01.

Under the condition that the area of the base substrate 01 is determined, compared with the related technology of not multiplexing the light-emitting control circuit 021, in the embodiment of the present disclosure, at least two subpixels 02 share the same one light-emitting control circuit 021, so that the area of other regions in the base substrate 01 except the region where the subpixel 02 is located is larger. In this way, it provides effective technical support for arranging the scan driver circuit 03 on the base substrate 01, that is, it provides technical support for the GIA display substrate with high per pixel inch (PPI).

Assuming that the transistors in the subpixel 02 are all N-type transistors, the working principle of the pixel provided by the embodiment of the present disclosure is introduced in combination with the adjacent two subpixels 02 multiplexing the same one light-emitting control circuit 021 shown in FIG. 4, and FIG. 6D is an operation timing diagram of the pixel circuit.

Referring to FIG. 4B, in the stage t1, in the nth row of subpixels 02, the second gate line G2n connected to the reset transistor T3 provides a gate driver signal at the first potential, and the reset transistor T3 is turned on. The third gate line G3n connected to the compensation transistor T5 also provides a gate driver signal at the first potential, and the compensation transistor T5 is turned on. Accordingly, the first initial signal terminal Vin1 may output the first initial signal at the second potential to the second electrode of the driving transistor T4 in the nth row subpixel 02 through the reset transistor T3, so as to reset the second electrode of the driving transistor T4. The second initial signal terminal Vin2 may output the second initial signal to the gate of the driving transistor T4 in the nth row subpixel 02 through the compensation transistor T5, and the second initial signal may be used as the compensation data Vref1. The stage t1 may also be referred to as the reset stage when driving the nth row of subpixel 02.

In the stage t2, in the nth row of subpixels 02, the third gate line G3n connected to the compensation transistor T5 continuously provides the gate driver signal at the first potential. Compensation transistor T5 remains "on". The second initial signal terminal Vin2 may continue to output the second initial signal to the gate of the driving transistor T4 in the nth row subpixel 02 through the compensation transistor T5. Under the coupling effect of the storage capacitor Cst, the potential of the gate of the drive transistor T4 may change with the potential of the second electrode of the driving transistor T4 until it becomes Vref1−Vth1, and Vth1 is the threshold voltage of the driving transistor T4. The stage t2 may be referred to as a compensation stage when driving the nth row of subpixels 02.

At the stage t3, in the nth row of subpixels 02, the first gate line Gin connected to the data writing transistor T2 starts to provide the gate driver signal at the first potential, and the data writing transistor T2 is turned on. The data line D1 outputs a data signal to the gate of the driving transistor T4 through the data writing transistor T2. The stage t3 may be referred to as the data writing stage when driving the nth row of subpixel 02.

At the stage t4, in the (n+1)th row of subpixels 02, the second gate line G2(n+1) connected to the reset transistor T3 provides the gate driver signal at the first potential, and the reset transistor T3 is turned on. The third gate line G3(n+1) connected to the compensation transistor T5 also provides the gate driver signal at the first potential, and the compensation transistor T5 is turned on. Accordingly, the first initial signal terminal Vin1 can output the first initial signal at the second potential to the second electrode of the driving transistor T4 in the (n+1)th row of subpixels 02 through the reset transistor T3, so as to reset the second electrode of the driving transistor T4. The second initial signal terminal Vin2 can output the second initial signal to the gate of the driving transistor T4 in the subpixel 02 in the (n+1)th row through the compensation transistor T5, and the second initial signal can be used as the compensation data Vref2 when the pixels in this row are driven. The stage t4 may be referred to as the reset stage when driving in the (n+1)th row of subpixels 02.

In the stage t5, in the (n+1)th row of subpixels 02, the third gate line G3(n+1) connected to the compensation transistor T5 continuously provides the gate driver signal at the first potential. Compensation transistor T5 remains "on". The second initial signal terminal Vin2 can continue to output the second initial signal to the gate of the driving transistor T4 in the subpixel 02 in the (n+1)th row through the compensation transistor T5. Under the coupling effect of the storage capacitor Cst in this row of subpixels 02, the potential of the gate of the driving transistor T4 in the row of subpixels 02 may change with the potential of the second electrode of the driving transistor T4 until it becomes Vref2−Vth2, and Vth2 represents the threshold voltage of the driving transistor T4. The stage t5 may be referred to as the compensation stage when driving the (n+1)th row of subpixels 02.

At the stage t6, in the (n+1)th row of subpixels 02, the first gate line G1(n+1) connected to the data writing transistor T2 starts to provide the gate driver signal at the first potential, and the data writing transistor T2 is turned on. The data line D1 can output a data signal to the gate of the driving transistor T4 in this row of subpixels 02 through the data writing transistor T2. The stage t6 may be referred to as the data writing stage when driving the (n+1)th row of subpixels 02.

It is to be noted that, referring to FIG. 6D, in the stages t1, t2, t4, and t5, the light-emitting control line EMn connected with the light-emitting control transistor T1 shared by the nth row of subpixels 02 and the (n+1)th row of subpixels 02 always provides the light-emitting control signal at the first potential. The DC power supply terminal VDD can output the DC power supply signal to the first electrode of the driving transistor T4 included in each of the two rows of subpixels 02 through the light-emitting control transistor T1. After the stage t3, in the nth row of subpixels 02, the driving transistor T4 can output a driver signal to the connected light-emitting elements 023 based on the DC power signal and the data signal, so as to drive the nth row of light-emitting elements 023 to emit light. After the stage t6, in the (n+1)th row of subpixels 02, the driving transistor T4 can output a driver signal to the light-emitting element 023 which is connected with driving transistor T4 based on the DC power signal and the data signal, so as to drive the light-emitting elements 023 in the (n+1)th row to emit light.

It is to be noted that the examples of the scan driver circuit (GIA) provided in the display array of the display area, and the specific structure of pixel circuit described in the embodiment of the present disclosure are only exemplary. No limitation is imposed to the specific structure of the scan circuit and pixel circuit in the embodiments of the present disclosure, for example, for the arrangement of the pixel circuit, whether the light-emitting control electric circuit is shared or not, the number of first signal lines corresponding to each row of subpixels, etc., those skilled in the art can design according to specific requirements.

Figure 7A:
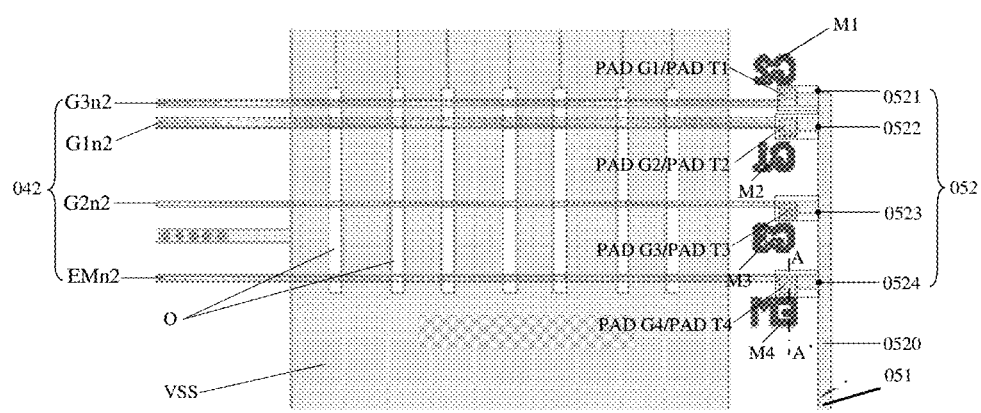
FIG. 7A is a schematic diagram of the second part of the first signal line and the part D1 of the test lead included in the non-display area of FIG. 1, or a schematic diagram of the second part of the first signal line and the part D2 of the test lead in FIG. 5A.
Figure 7B:
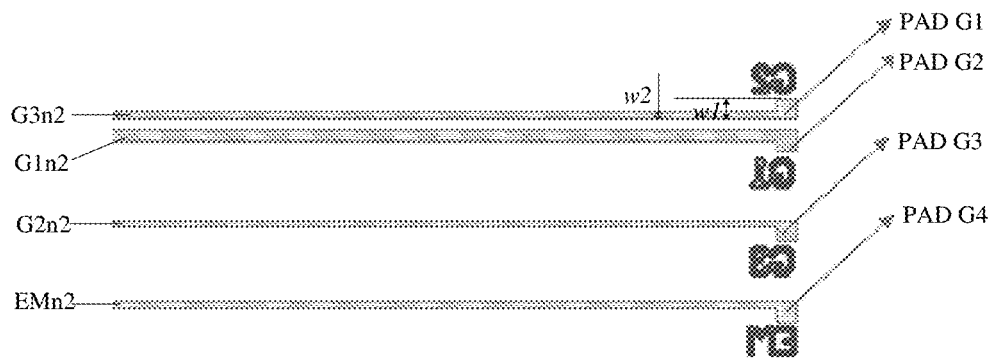
FIG. 7B is a single-layer schematic diagram of the second parts of the first signal lines in FIG. 7A.
Figure 7C:
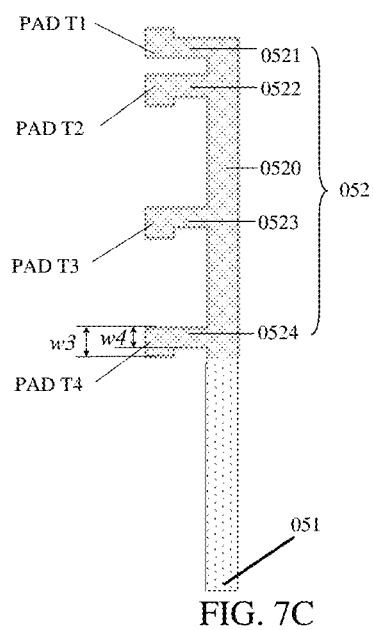
FIG. 7C is a single-layer schematic diagram of the test leads in FIG. 7A.
Figure 8A:
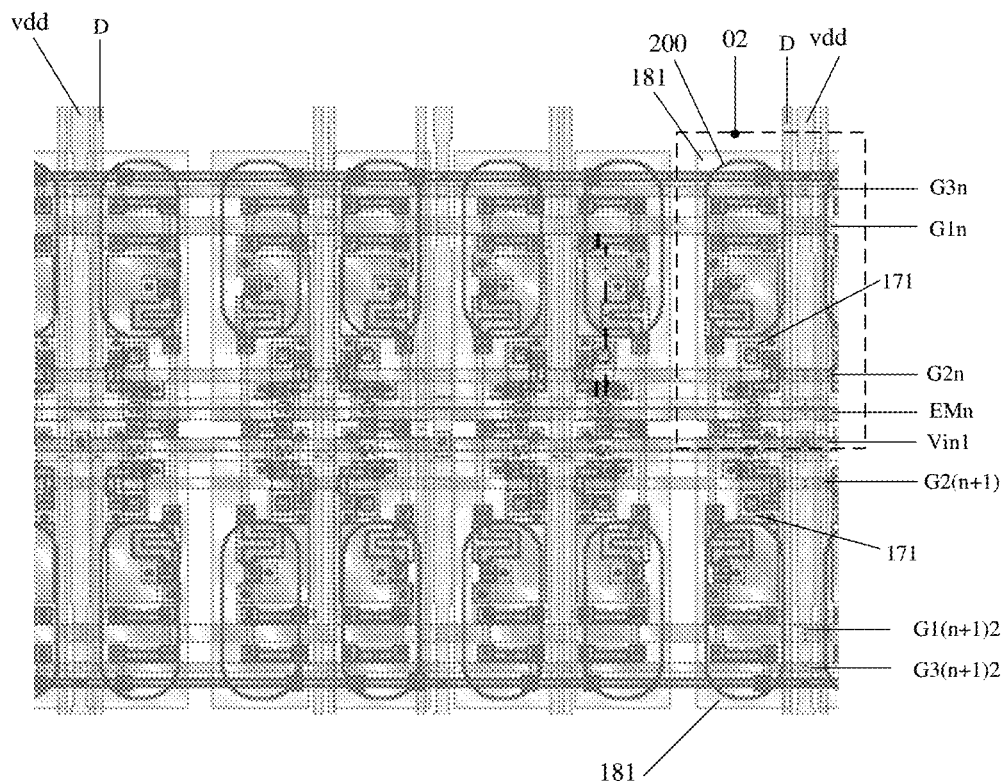
FIG. 8A is a schematic structural diagram of subpixels of a display area of a display panel provided by an embodiment of the present disclosure.
Figure 8B:
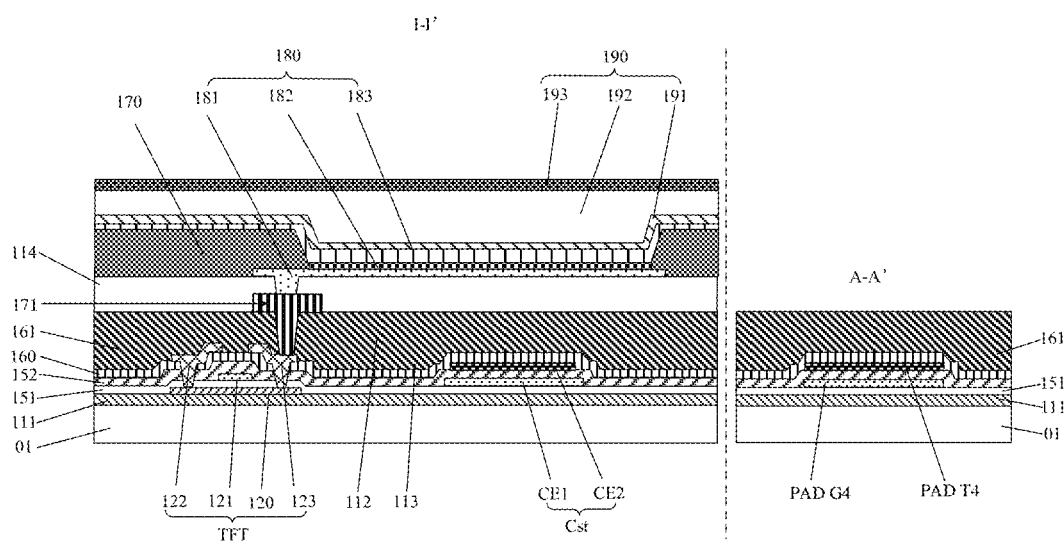
FIG. 8B is a schematic cross-sectional view taken along the line I-I' in FIG. 8A and the line A-A' in FIG. 7A.

FIG. 7A is a schematic diagram of the second part including the first signal line and the part D1 of the test lead in the non-display area of FIG. 1, or a schematic diagram of the second part including the first signal line and the part D2 of the test lead in FIG. 5A; FIG. 7B is a single-layer schematic diagram of the second parts of the first signal lines in FIG. 7A; FIG. 7C is a single-layer schematic diagram of the test leads in FIG. 7A; FIG. 8A (similar to the subpixel structure in FIG. 5A that omits some functional layers compared with FIG. 8A) is a schematically structural diagram of subpixels of a display area of a display panel provided by an embodiment of the present disclosure; FIG. 8B is a schematically cross-sectional view taken along the line I-I' in FIG. 8A and the line A-A' in FIG. 7A. Referring to FIGS. 1 and 7A-8B, before the display panel 10 is tested, the first signal line 04 and the test lead 05 are arranged in different layers and insulated from each other, and the orthographic projection of the second part 042 of the first signal line 04 on the substrate at least partially overlaps with the orthographic projection of the test lead 05 on the substrate. When the display panel 10 is tested, the orthographic projection of a part of the second part 042 of the first signal line 04 on the base substrate 01 overlaps with the orthographic projection of a part of the test lead 05 on the base substrate 01, and the part of the second part 042 of the first signal line 04 is connected to the part of the test lead 05. For example, each pixel row of the plurality of pixel rows includes a plurality of first signal lines 04, and the display panel 10 includes a plurality of test pads 061 and a plurality of test leads 05, each of the plurality of test pads 061 is electrically connected with at least one test lead 05 of the plurality of test leads 05 in the non-display area; for example, each of the plurality of test pads 061 is electrically connected with a plurality of test leads 05, so as to reduce the number of the test pads 061, save the space of the test circuit board and reduce the manufacturing difficulty of the test pads. Before the display panel 10 is tested, the orthographic projection of each of the plurality of test leads 05 on the base substrate 01 at least partially overlaps with the orthographic projection of the second parts 042 of a plurality of first signal lines 04 in at least one pixel row of the display panel 10 on the base substrate 01. It is to be noted that, in FIG. 7A, the relationship between the first signal line and the test lead is described by using the second parts G3n2/G1n2/G2n2/EMn2 of the four first signal lines G3n/G1n/G2n/EMn connected to the pixel circuit of the same subpixel 02 in FIG. 5A as an example, for example, it is the same for each first signal line 04.

For example, before the display panel 10 is tested, the orthographic projection of each of the plurality of test leads 05 on the substrate at least partially overlaps with the orthographic projection of the second parts 042 of the plurality of first signal lines 04 of the same one pixel row of the plurality of pixel rows on the substrate, as shown in FIGS. 7A-7C. Or, in at least another embodiment of the present disclosure, the orthographic projection of each of the plurality of test leads 05 on the substrate at least partially overlaps with the orthographic projection of the second parts 042 of the plurality of first signal lines 04 of the adjacent two pixel rows in the plurality of pixel rows on the substrate. In this way, the plurality of first signal lines 04 are connected to the same one test pad, which can reduce the number of the test pads 061, save the space of the test circuit board and reduce the manufacturing difficulty of the test pads.

For example, no switch device, including a thin film transistor (TFT) or the like, is provided between each of the plurality of first signal lines 04 and the test lead 05 of which the orthographic projections on the base substrate 01 overlap with each other.

For example, as shown in FIGS. 7A-7B, the display panel 10 further includes a plurality of alignment marks M1/M2/M3/M4, the patterns of which are different from each other, are arranged in one-to-one correspondence with the plurality of first signal lines 04, and are spaced apart from the overlapping area of the corresponding first signal lines 04. FIGS. 7A-7B is illustrated by using four alignment marks M1/M2/M3/M4 corresponding to four first signal lines G3n/G1n/G2n/EMn as an example. When the display panel 10 is tested, a plurality of alignment marks M1/M2/M3/M4 are configured to be respectively recognized by an alignment device, to locate the preset positions in the overlapping areas of the corresponding first signal lines 04. For example, each alignment marks is opaque. For example, the alignment mark is provided in the same layer as any one selected from a group consisting of the active layer of the driving transistor T4, the first signal lines 04, and the test leads 05. The active layer of the driving transistor T4, the first signal lines 04, and the test leads 05 are in the same layer as the target structure for alignment, that is, the first signal lines 04 and the test leads 05, or are relatively arranged near the layer where the target structure is located. Arranging the alignment marks in these layers is beneficial to the accuracy of alignment identification.

For example, as shown in FIGS. 7A-7C, each of the plurality of test leads 05 includes a main lead 0520 and a plurality of sub-leads 0521/0522/0523/0524. The main body 0520 includes a first end 051 connected to the test pad 061 and a second end 052 away from the test pad 061. For example, the first end 051 of the main body 0520 of each of a plurality of test leads 05 is connected with a plurality of test pads 06 in one-to-one correspondence. For example, the second end 052 extends along the second direction, and the second direction is substantially perpendicular to the first direction; a plurality of sub-leads 0521/0522/0523/0524 are connected to the second end 052 of the main lead 0520, protrude from the second end 052, and are in one-to-one correspondence with the second parts G3n2/G1n2/G2n2/EMn2 of the plurality of first signal lines G3n/G1n/G2n/EMn. Because one main body lead 0520 is provided with a plurality of sub-leads 0521/0522/0523/0524 that are in one-to-one correspondence with the second parts G3n2/G1n2/G2n2/EMn2 of the plurality of first signal lines G3n/G1n/G2n/EMn, the number of test pads is decreased. As shown in FIGS. 7A-7C, before the display panel 10 is tested, the orthographic projection of each of the plurality of sub-leads 0521/0522/0523/0524 on the base substrate 01 at least partially overlaps with the orthographic projection of the second part of the corresponding first signal line G3n/G1n/G2n/EMn on the base substrate 01.

For example, as shown in FIG. 7B, before the display panel 10 is tested, the end of the second part of each of the plurality of first signal lines 04 near the corresponding sub-leads 0521/0522/0523/0524 has a first test pads PAD G1/PAD G2/PAD G4/PAD G4, respectively. As shown in FIG. 7B, the width w1 of each of the first test pads PAD G1/PAD G2/PAD G4/PAD G4 in the line width direction of the respective first signal line 04 is larger than the line width w2 of the respective first signal line 04. The first end of each of the plurality of sub-leads 0521/0522/0523/0524 is connected to the main lead 0520, and the second end of each of the plurality of sub-leads 0521/0522/0523/0524 has a second test pad PAD T1/PAD T2/PAD T3/PAD T4. The width w3 of each of the second test pads PAD T1/PAD T2/PAD T3/PAD T4 in the line width direction of the respective sub-lead 0521/0522/0523/0524 is larger than the line width w4 of the respective sub-lead 0521/0522/0523/0524. The orthographic projection of each of the second test pads PAD T1/PAD T2/PAD T3/PAD T4 on the base substrate 01 at least partially overlaps with the orthographic projection of the corresponding first test pad PAD G1/PAD G2/PAD G4/PAD G4 of the first signal line 04 on the base substrate 01. That is, the ends of the second part of the first signal line 04 and the corresponding sub-lead, that are near each other are overlapped with each other in the direction perpendicular to the base substrate 01. Furthermore, because the width of the each of the first test pads PAD G1/PAD G2/PAD G4/PAD G4 in the line width direction of the corresponding first signal line 04 is larger than the line width of the corresponding first signal line 04, the overlapping area of the second part of the first signal line 04 and the corresponding sub-lead in the direction perpendicular to the base substrate 01 can be increased, and the overlapping parts can be electrically connected when the display panel 10 needs to be tested.

As shown in FIG. 7A, the first power supply line VSS includes a plurality of openings O, for example, a plurality of strip-shaped openings O, and the plurality of openings O at least partially overlap with the plurality of first signal lines 04 in the direction perpendicular to the base substrate 01, so as to decrease the overlapping area of the first power supply line VSS and the plurality of first signal lines 04, and reduce the probability of short circuit at the overlapping place caused by the defect of charge accumulation.

As shown in FIG. 8B, the pixel circuit of each subpixel 02 of the display panel 10 includes a thin film transistor (TFT), such as a light-emitting control transistor T4, a light-emitting element 180, and a storage capacitor Cst. The thin film transistor includes an active layer 120, a gate 121, and source and drain electrodes 122/123. The storage capacitor Cst includes a first plate CE1 and a second capacitor plate CE2. The light-emitting element 180 includes a cathode 183, an anode 181, and a light-emitting layer 182 between the cathode 183 and the anode 181. The anode 181 is electrically connected to one of the source and drain electrodes 122/123, such as the drain electrode 123, of the thin film transistor TFT. In other embodiments, the anode 181 and the drain electrode 123 of the thin film transistor TFT may be electrically connected through a transfer electrode. For example, the light-emitting element may be an organic light-emitting diode (OLED) or a quantum dot light-emitting diode (QLED), and accordingly, the light-emitting layer 182 is an organic light-emitting layer or a quantum dot light-emitting layer.

As shown in FIG. 8B, the display panel 10 further includes an interlayer insulation layer 152. Before the display panel 10 is tested, the interlayer insulation layer 152 is located between the first signal line 04 and the test lead 05 to insulate the first signal line 04 and the test lead 05, and the first signal line 04, the interlayer insulation layer 152, and the test lead 05 are configured to be melted by laser at a preset position to enable the first signal line 04 to be electrically connected with the test lead 05 at the preset position, and the preset position is located in the overlapping region where the orthographic projection of the first signal line 04 on the base substrate 01 overlaps with the orthographic projection of the test lead 05. When the display panel 10 is tested, the test lead 05, the interlayer insulation layer, and the tested first signal line 04 at the preset positon are irradiated by the laser, and the test lead 05, the interlayer insulation layer, and the tested first signal line 04 are melted and fused, so that the fused test lead 05 is electrically connected with the first signal line 04 at the preset position, and the first signal line 04 is electrically connected with the corresponding test pad 061 through the corresponding test lead 05. In this way, the test signal output by the first signal line 04 can be obtained through the test circuit board 06 to detect whether the scan driver circuit 03 of the display panel 10 works normally, or not.

For example, the material of the interlayer insulation layer 152 may be silicon nitride, or silicon oxide, or silicon oxynitride, so that the first signal line 04, the interlayer insulation layer 152, and the test lead 05 can be melted by laser at the preset position to enable the first signal line 04 to be electrically connected with the test lead 05 at the preset position. For example, the base substrate 01 is a glass substrate, a quartz substrate, etc., which is heat-resistant and property-stable. In this way, the structure and performance of the base substrate 01 cannot be affected when the first signal line 04, the interlayer insulation layer 152, and the test lead 05 are melted by the laser at the preset position.

For example, the materials of the first signal line 04 and the test lead 05 are a metal materials, for example, a metal or an alloy, such as copper, aluminum, copper alloy, aluminum alloy, etc. The materials listed above are only exemplary, and the materials of the first signal line 04 and the test lead 05 are not limited in the embodiments of the present disclosure.

For example, as shown in FIG. 8B, in one example, before the display panel 10 is tested, the test lead 05 is located on the side of the first signal line 04 away from the base substrate, and no conductive layer is provided between the first signal line 04 and the base substrate. In this way, when the display panel 10 is tested, after the laser passes through the base substrate 01 at the preset position, the laser can only act on the tested first signal line 04, the interlayer insulation layer, and the test lead 05 in sequence by controlling parameters, such as laser intensity, and cannot act on any other conductive layer, so as to prevent affecting on other conductive layer.

For example, as shown in FIG. 8B, the display panel 10 further includes a first gate insulation layer 151 located between the active layer 120 and the gate 121, a second gate insulation layer 152 located on the gate 121, and an interlayer insulation layer 160. The second gate insulation layer 152 is located between the first plate CE1 and the second capacitor plate CE2, so that the first plate CE1, the second gate insulation layer 152, and the second capacitor plate CE2 constitute the storage capacitor Cst. The interlayer insulation layer 160 covers the second capacitor plate CE2.

For example, as shown in FIG. 8B, the display panel 10 further includes an insulation layer 113 (e.g., a passivation layer) covering the pixel circuit and a first planarization layer 112. The display area 201 further includes a pixel defining layer 170 for defining the plurality of subpixels, spacers (not shown) on the pixel defining layer 170, and other structures. As shown in FIG. 2, in some embodiments, the insulation layer 113 (e.g., a passivation layer made of silicon oxide, silicon nitride or silicon oxynitride) is arranged on the source and drain electrodes 122/123, the first planarization layer 112 is disposed on the insulation layer 113, and the anode 181 is electrically connected to the drain electrode 123 through a via hole penetrating through the first planarization layer 112 and the insulation layer 113.

For example, as shown in FIG. 8B, the display panel further includes an encapsulation layer 190, the encapsulation layer 190 includes a plurality of encapsulation sublayers 191/192/193. For example, the first encapsulation layer 291 is arranged in the same layer as the first encapsulation sublayer 191 in the encapsulation layer 190, the second encapsulation layer 292 is arranged in the same layer as the second encapsulation sublayer 192 in the encapsulation layer 190, and the third encapsulation layer 293 is arranged in the same layer as the third encapsulation sublayer 193 in the encapsulation layer 190. For example, both the first encapsulation layer 291 and the third encapsulation layer 293 may include inorganic encapsulation materials, such as silicon oxide, silicon nitride, and silicon oxynitride. The second encapsulation layer 292 may include organic materials, such as resin materials, etc. The multi-layer packaging structure of the display panel 10 can achieve a better packaging effect to prevent impurities, such as water vapor or oxygen, from permeating into the display panel 10.

In some embodiments, as shown in FIG. 8B, the display panel 10 further includes a buffer layer 111 on the substrate 210, the buffer layer 111 serves as a transition layer, which can prevent harmful substances in the substrate 1 from intruding into the interior of the display panel 10, such as the display area 01A, and can also increase the adhesion of films of the display panel 10 on the substrate 1. For example, the material of the buffer layer 111 may include a single-layer or multi-layer structure formed by an insulating material, such as silicon oxide, silicon nitride, and silicon oxynitride.

For example, the storage capacitor Cst of the pixel circuit includes a first plate CE1 and a second plate CE2. The first plate CE1 is electrically connected to the gate of the driving transistor T4, and the orthographic projection of the second plate CE2 on the base substrate 01 at least partially overlaps with the orthographic projection of the first plate CE1 on the base substrate 01. For example, in the embodiment shown in FIG. 8B, before the display panel 10 is tested, the first signal line 04 is arranged on the same layer as the first plate CE1 of the storage capacitor Cst, and the test lead 05 is arranged on the same layer as the second plate CE2 of the storage capacitor Cst, so that the first signal line 04 and the first plate CE1 are formed by one same patterning process, and the test lead 05 and the bottom second plate CE2 are formed by one same patterning process, and the layer structure and manufacturing process of the display panel 10 are simplified.

As can be seen from FIGS. 8A-8B and 9A-9L, the display surface 10 includes a semiconductor layer, a first conductive layer, a second conductive layer, a third conductive layer, a fourth conductive layer, and a fifth conductive layer that are sequentially disposed on the base substrate 01.

Figure 9A:
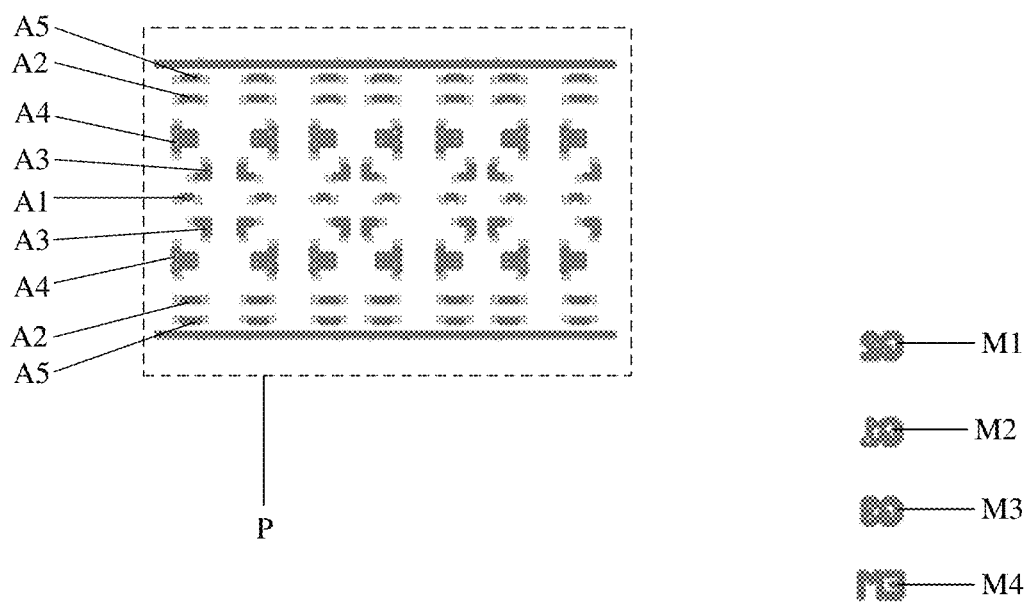
FIG. 9A is a schematic diagram of a semiconductor layer of the display panel shown in FIG. 8A.
Figure 9B:
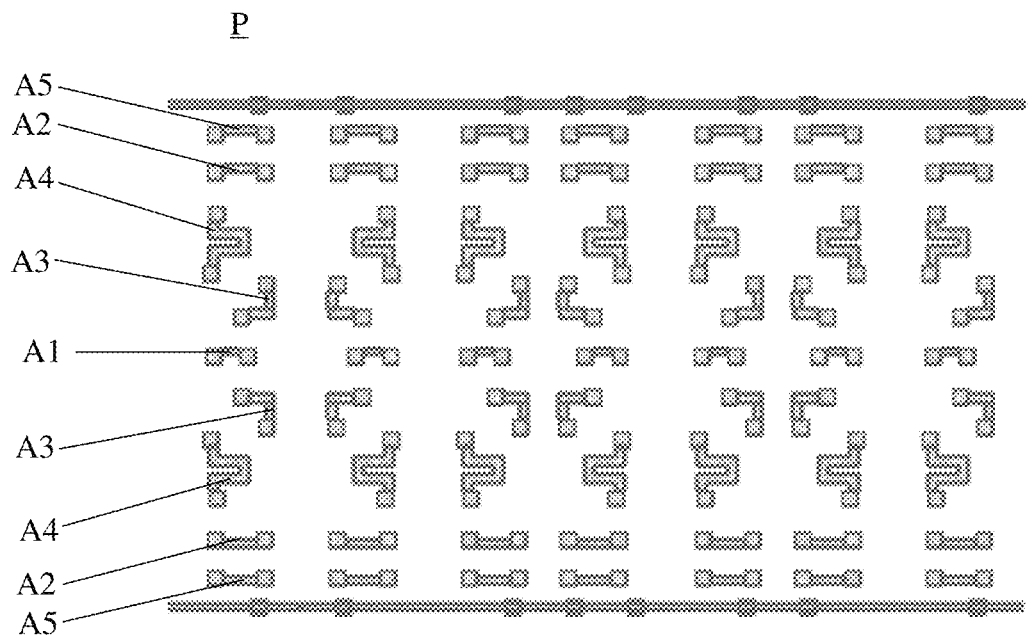
FIG. 9B is an enlarged schematic diagram of the semiconductor layer of the display area of the display panel in FIG. 9A.
Figure 9C:
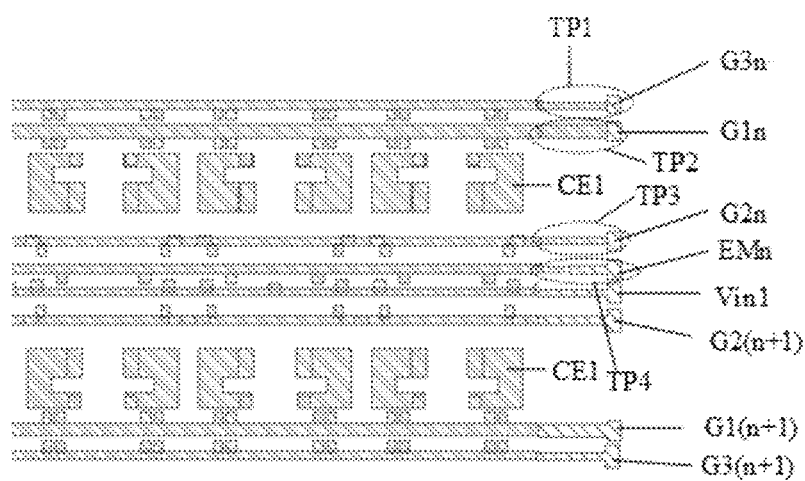
FIG. 9C is a schematic diagram of a first conductive layer of the display panel shown in FIG. 8A.

For example, as shown in FIGS. 9A-9B, the semiconductor layer includes active patterns A1-A5 of the first to fifth transistors T1-T5 (as shown in FIG. 4A). For example, the alignment marks M1/M2/M3/M4 are arranged in the semiconductor layer, and are arranged in the same layer as the active patterns A1-A5, that is, the active layer of the driving transistor T4.

Figure 9D:
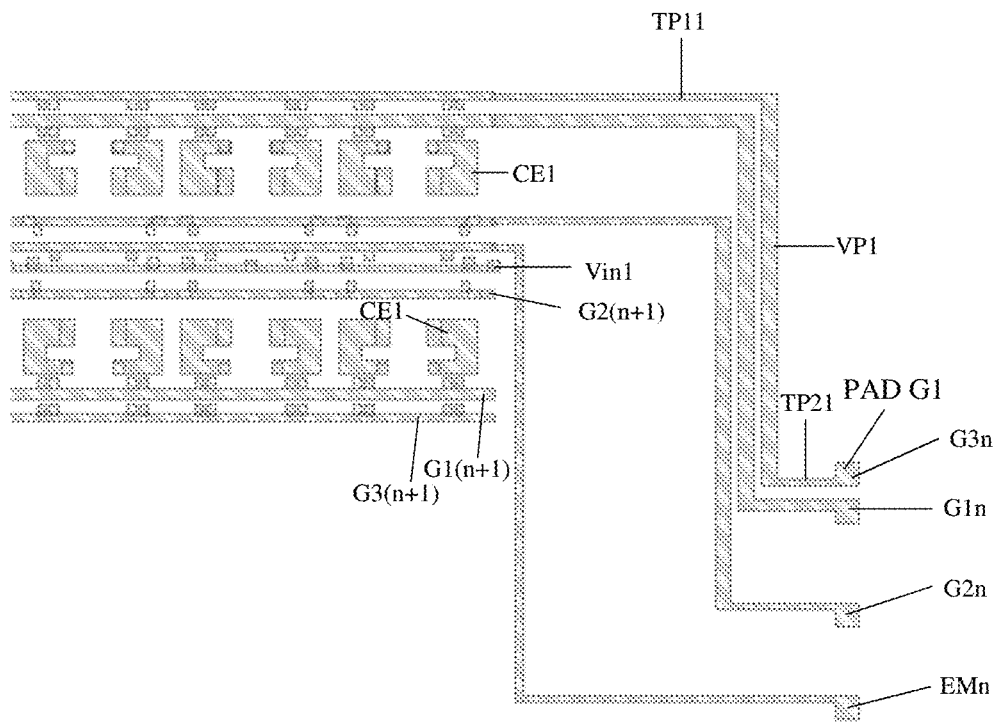
FIG. 9D is another schematic diagram of the first conductive layer of the display panel provided by at least one embodiment of the present disclosure.
Figure 9E:
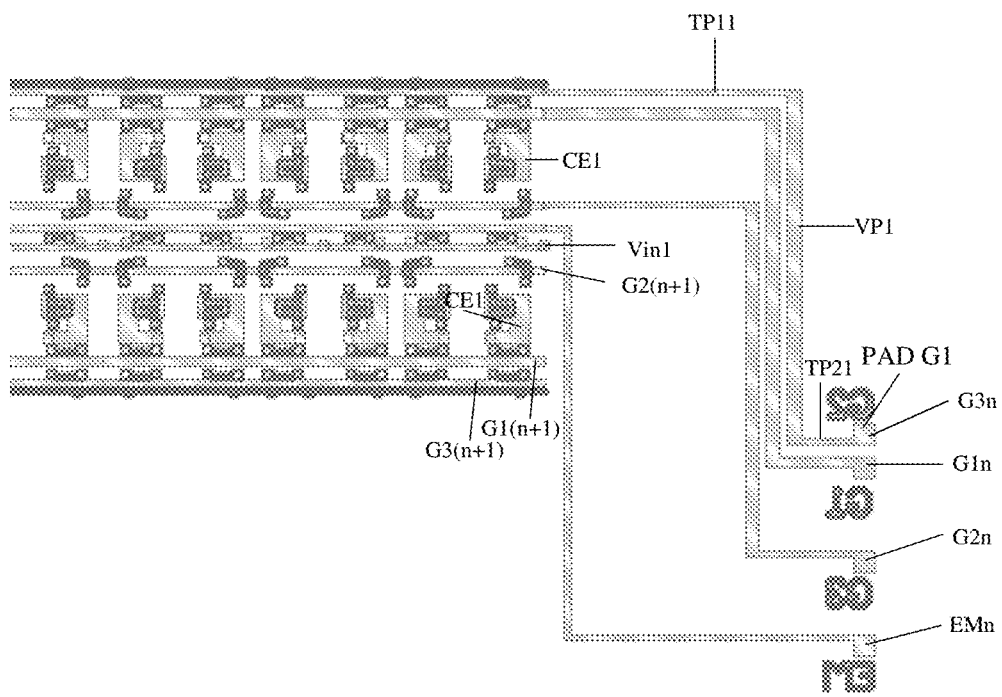
FIG. 9E is a schematic diagram of the superposition of the semiconductor layer shown in FIG. 9A and the first conductive layer shown in FIG. 9D.

For example, as shown in FIGS. 9D-9E, the first conductive layer includes the gate of each transistor of the pixel circuit, the first signal line 04, and the first plate CE1. For example, the gate line Gin is the scanning line, the gate line G3n is the first reset control line, the gate line G2n is the second reset control line, and the gate line EMn is the light-emitting control line.

Figure 9F:
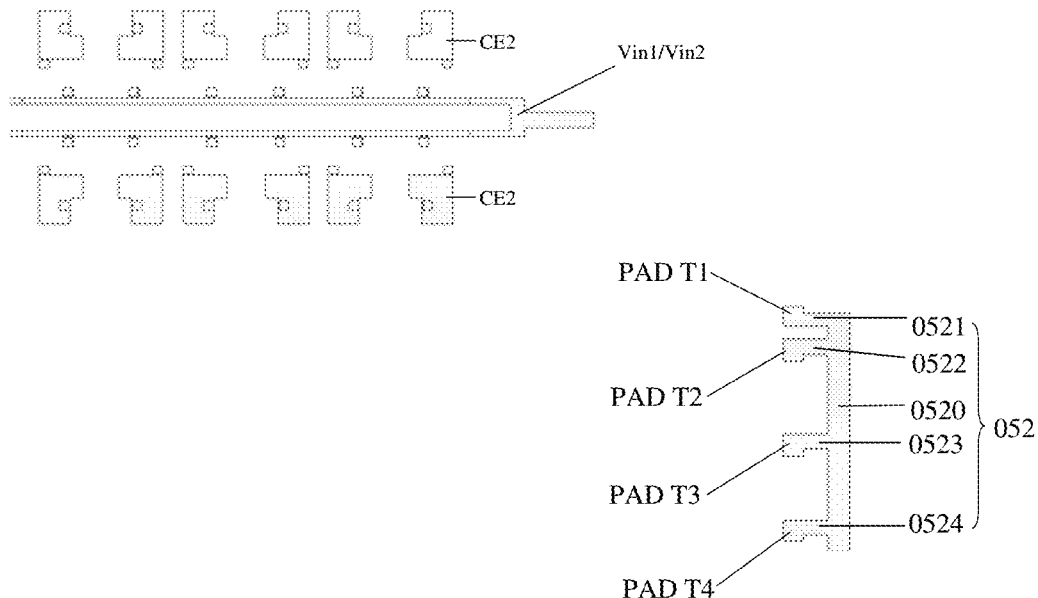
FIG. 9F is a schematic diagram of the second conductive layer of the display panel shown in FIG. 8A.
Figure 9G:
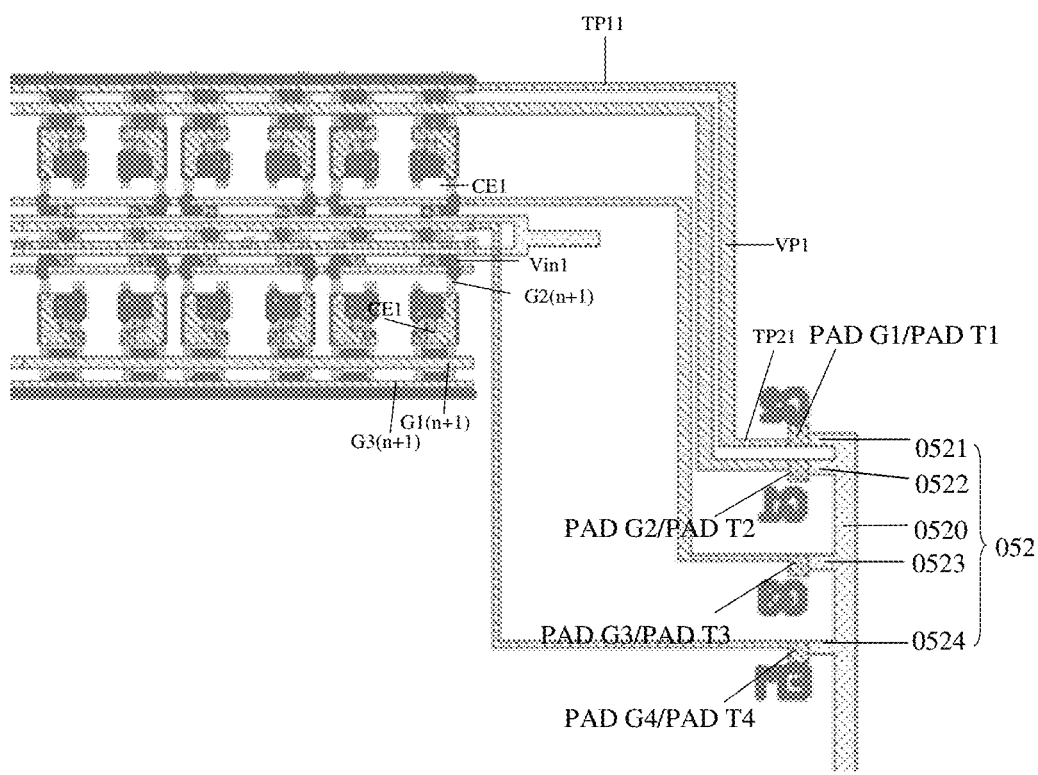
FIG. 9G is a superimposed schematic diagram of the semiconductor layer shown in FIG. 9A, the first conductive layer shown in FIG. 9D, and the second conductive layer shown in FIG. 9F.

As shown in FIG. 9F, the second conductive layer includes the second plate CE2 of the pixel circuit and the test leads 05 (only the second end 052 of one test lead 05 is shown in FIG. 9F). The second conductive layer further includes a first reset signal line Vin1 and a second reset signal line Vin2, that is, the first reset signal line Vin1 and the second reset signal line Vin2 shown in FIG. 4A.

Figure 9H:
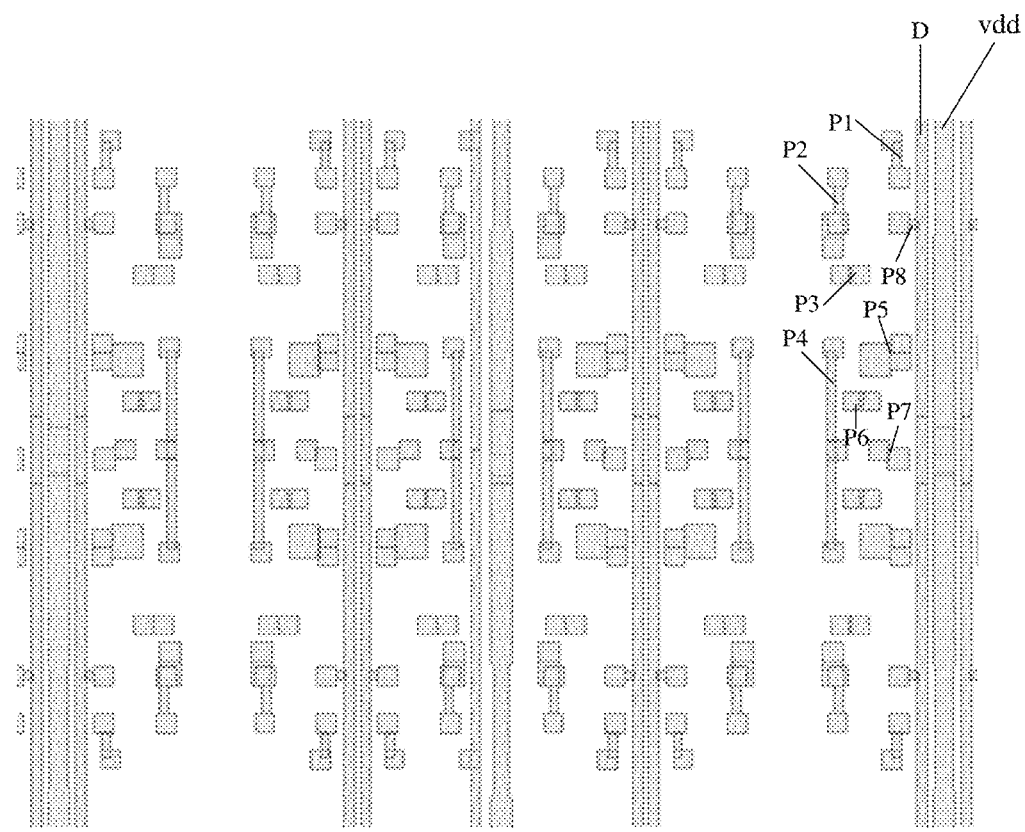
FIG. 9H is a schematic diagram of a third conductive layer of the display panel shown in FIG. 8A.
Figure 9I:
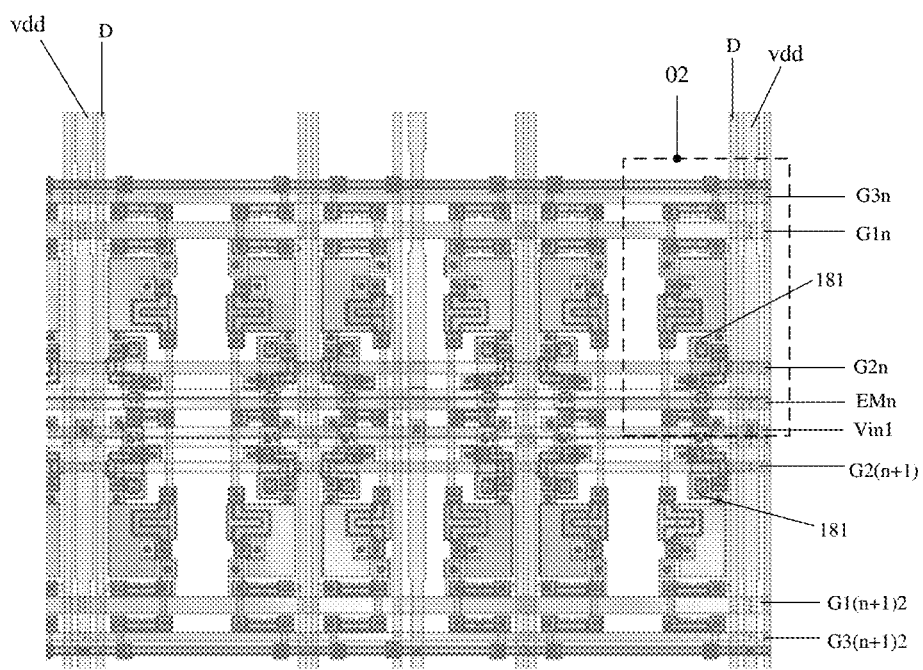
FIG. 9I is a schematic diagram of the superposition of the semiconductor layer shown in FIG. 9A, the first conductive layer shown in FIG. 9D, the second conductive layer shown in FIG. 9F and the third conductive layer shown in FIG. 9H.
Figure 9J:
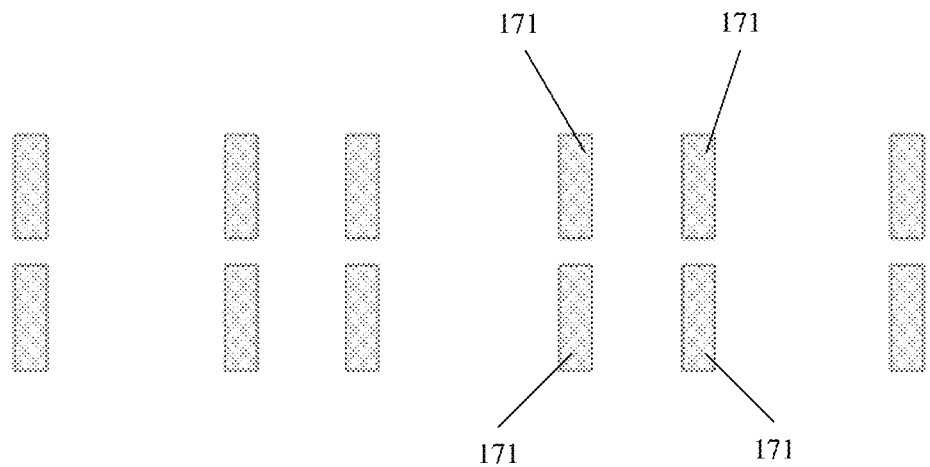
FIG. 9J is a schematic diagram of a fourth conductive layer of the display panel shown in FIG. 8A.
Figure 9K:
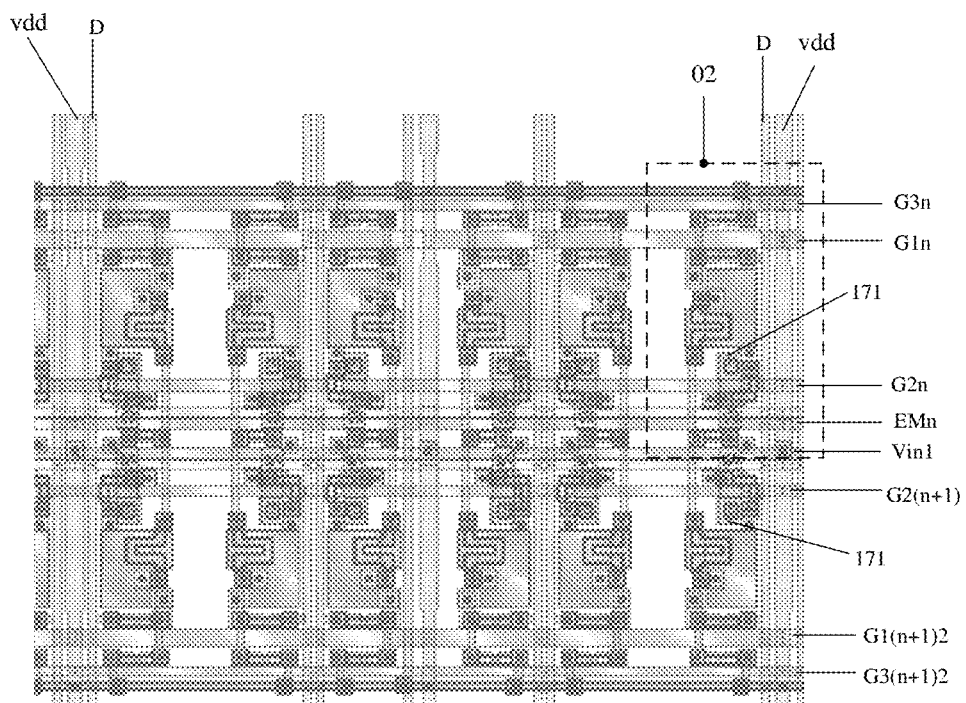
FIG. 9K is a schematic diagram of the superposition of the semiconductor layer shown in FIG. 9A, the first conductive layer shown in FIG. 9D, the second conductive layer shown in FIG. 9F, the third conductive layer shown in FIG. 9H, and the fourth conductive layer shown in FIG. 9J.
Figure 9L:
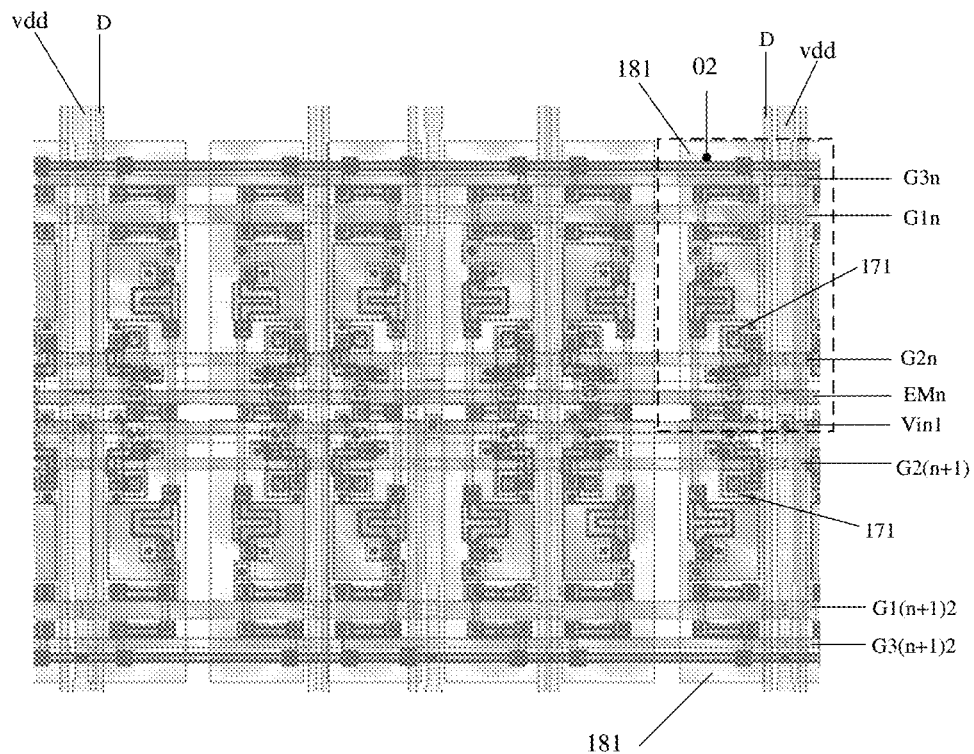
FIG. 9L is a schematic diagram of the superposition of the semiconductor layer shown in FIG. 9A, the first conductive layer shown in FIG. 9D, the second conductive layer shown in FIG. 9F, the third conductive layer shown in FIG. 9H, the fourth conductive layer shown in FIG. 9J and the anode layer.

As shown in FIGS. 9H-9I, the third conductive layer includes the data line D and the first power supply line VDD, and a plurality of connection structures P1-P8, the plurality of connection structures P1-P8 are configured to connect the electrodes of the thin film transistors T1-5T in FIGS. 4B and 8A, connect the electrodes of the thin film transistors T1-5T with the active layer, and connect the electrodes of the thin film transistors with the data line or the first power supply line VDD.

Referring to FIGS. 9J-9L and 8B, the fourth conductive layer includes an auxiliary electrode 171. The auxiliary electrode 171 connects the drain of the thin film transistor T4 and the anode 181.

Figure 8C:
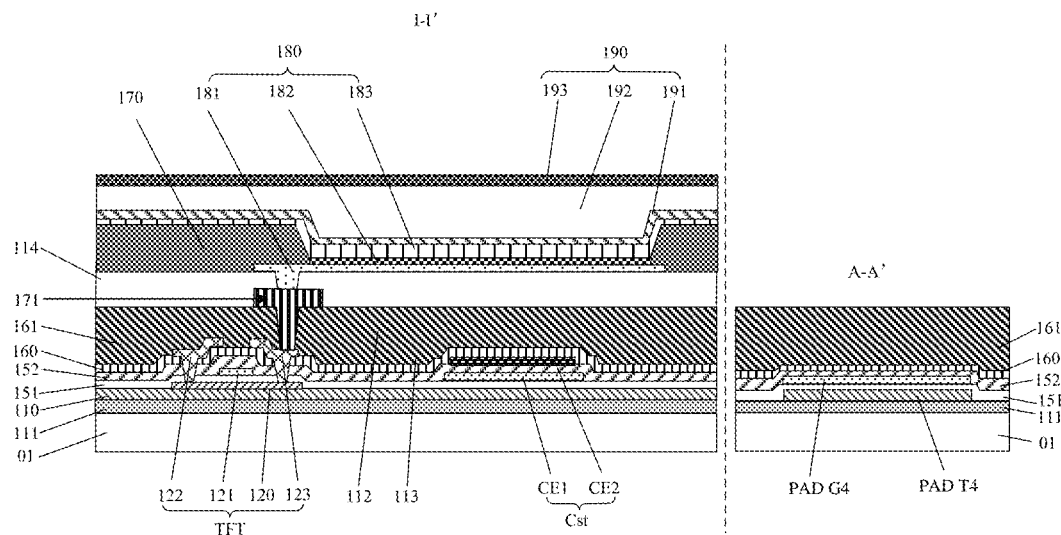
FIG. 8C is another schematic cross-sectional view taken along the line I-I' in FIG. 8A and the line A-A' in FIG. 7A.

FIG. 8C is another schematic cross-sectional view taken along the line I-I' in FIG. 8A and the line A-A' in FIG. 7A. For example, in another embodiment, as shown in FIG. 8C, the test lead 05 is located on the side of the first signal line 04 near the base substrate 01, and no conductive layer is provided between the test lead 05 and the base substrate 01. In this case, the interlayer insulation layer between the test lead 05 and the first signal line 04 is the first gate insulation layer 151. In this way, when the display panel 10 is tested, after the laser passes through the base substrate 01 at the preset position, by controlling parameters, such as the intensity of the laser, the laser can only act on the test lead 05, the interlayer insulation layer 151, and the tested first signal line 04 in sequence, and the laser cannot act on any other conductive layer, thus preventing the effect on other conductive layers.

For example, in the embodiment shown in FIG. 8C, the first signal line 04 is arranged on the same layer as the first plate CE1 of the storage capacitor Cst, and the display panel 10 further includes a light shielding layer 110, the light shielding layer 110 is located on the side of the first signal line 04 near the base substrate 01, and the orthographic projection of the channel region of the driving transistor T4 on the base substrate 01 is within the orthographic projection of the light shielding layer 110 on the base substrate 01. The test leads 05 and the bottom light shielding layer 110 are arranged in the same layer, so that the test leads 05 and the bottom light shielding layer 110 are formed by one same patterning process, thereby simplifying the layer structure and manufacturing process of the display panel 10.

For example, as shown in FIGS. 1 and 5A, the first test pads PAD G1/PAD G2/PAD G4/PAD G4 of a plurality of first signal lines 04 are spaced apart from each other along the second direction, and a plurality of sub-leads 0521/0522/0523/0524 corresponding to the plurality of first signal lines 04 are spaced apart from each other along the second direction. And the second test pads PAD T1/PAD T2/PAD T3/PAD T4 of the plurality of sub-leads 0521/0522/0523/0524 are spaced apart from each other along the second direction, so as to reasonably utilize the limited space of the non-display area 01B.

For example, the second part of each of at least a part of (some of) the first signal lines 04 includes a first transverse part, and the first transverse parts of the second parts of the first signal lines are respectively the second part G3$n$2/G1$n$2/G2$n$2/EMn2 of the plurality of first signal lines G3$n$/G1$n$/G2$n$/EMn shown in FIGS. 5A and 7A, for example. The first transverse parts G3$n$2/G1$n$2/G2$n$2/EMn2 extend in the first direction and are connected with the first portions of the corresponding first signal lines G3$n$/G1$n$/G2$n$/EMn, the ends of the first transverse parts G3$n$2/G1$n$2/G2$n$2/EMn2, which are away from the first parts of the corresponding first signal lines G3$n$/G1$n$/G2$n$/EMn, respectively include the first test pads padg1/padg2/padg4, and the first transverse parts G3$n$2/G1$n$2/G2$n$2/EMn2 of the plurality of first signal lines 04 are arranged in the second direction, so as to make full use the dimension of the non-display area 01B in the second direction. Or, referring to FIG. 9C again, the second parts G3$n$2/G1$n$2/G2$n$2/EMn2 of the plurality of first signal lines G3$n$/Gin/G2$n$/EMn respectively include the first transverse parts TP1/TP2/TP3/TP4.

For example, in another embodiment, as shown in FIG. 9D, each of the at least part of the first signal lines 04, for example, for the first signal line G3$n$, the second part of the first signal line G3$n$ includes a first transverse part TP11, a first longitudinal part VP1, and a second transverse part TP21. The first transverse part TP11 extends in the first direction and is connected with the first part of the first signal line G3$n$, and the first longitudinal part VP1 is connected with the first transverse part TP11 and extends in the second direction; the second transverse part TP21 is connected with the first longitudinal part VP1 and extends in the first direction, and the end of the second transverse part TP21 away from the first longitudinal part VP1 includes the first test pad PAD G1. Similarly, other first signal lines are the same. The first transverse parts of the first signal lines G3$n$/G1$n$/G2$n$/EMn are arranged along the second direction, and the second transverse parts of the first signal lines G3$n$/G1$n$/G2$n$/EMn are also arranged along the second direction. The first test pads of the first signal lines of the display panel are not located on a same straight line extending along the second direction. In this way, it is possible to stagger the positions of the first test pads of the first signal lines of the entire display panel 10, and make full use of the limited space to arrange more first test pads, so as to arrange as many pixel rows as possible, and meet the requirements of high PPI display panels.

FIG. 10 is a schematic planar view of another display panel provided by at least one embodiment of the present disclosure. For example, the non-display area 01B includes a first non-display area 01B-1, a second non-display area 01B-2, and a third non-display area 01B-3, the first non-display area 01B-1, and the second non-display area 01B-2 are respectively located on the first side and the second side of the display area in the first direction, and the third non-display area 01B-3 is located on the first side of the display area in the second direction. The base substrate 01 includes a first edge 011 near the first non-display area 01B-1 and extending in the second direction, a second edge 012 near the second non-display area 01B-2 and extending in the second direction, and a third edge 013 near the third non-display area 01B-3 and extending in the first direction. For example, in the embodiment shown in FIG. 1, the first signal lines 04 of the plurality of pixel rows all extend from the display area 01A to the first non-display area 01B-1, the first signal lines 04 of the plurality of pixel rows are connected with the test leads 05 in the first non-display area 01B-1, and a plurality of test pads 061 are located in the first non-display area 01B-1 and arranged along the third edge 013 of the base substrate 01. Or, in other embodiments, the first signal lines 04 of a plurality of pixel rows are connected to the test leads 05 in the first non-display area 01B-1, and a plurality of test pads 061 are located in the first non-display area 01B-1 and arranged along the first edge of the base substrate 01, that is, along the second direction; or, in other embodiments, the first signal lines 04 of a plurality of pixel rows are connected to the test leads 05 in the second non-display area 01B-2, and a plurality of test pads 061 are located in the second non-display area 01B-1 and arranged along the first edge of the base substrate 01, that is, along the second direction.

For example, a first part of the first signal lines 04 in the plurality of pixel rows extends from the display area to the first non-display area 01B-1, and the first part of the first signal lines 04 is connected with the test leads 05 in the first non-display area 01B-1. A second part of the first signal lines 04 in the pixel rows extends from the display area 01A to the second non-display area 01B-2, and the second part of the first signal lines 04 is connected with the test leads 05 in the second non-display area 01B-2. The first part of the test pads 06 is located in the first non-display area 01B-1 and arranged along the first edge 011 of the base substrate 01, and the second part of the test pads 06 is located in the second non-display area 01B-2 and arranged along the second edge 012 of the base substrate 01. Or, both the first part of the test pad and the second part of the test pad are located in the third non-display area 01B-3 and arranged along the third edge 013 of the base substrate 01.

For example, a plurality of test circuit boards 06 are flexible, such as the above-mentioned chip on film (COF), and can be bent to the back of the display panel 10. For example, the first non-display area 01B-1 and/or the second non-display area 01B-2 where the test leads 05 are arranged can adopt a flexible printed circuit board, which can be bent or bent to the back of the display panel 10 to reduce the frame width of the display panel.

At least one embodiment of the present disclosure also provides a display apparatus, and the display apparatus includes any of the above-mentioned display panels 10 provided by the embodiments of the present disclosure.

At least one embodiment of the present disclosure also provides a test method of any of the above-mentioned display panels provided by the embodiments of the present disclosure, and the test method includes: acquiring the test signal output by the first signal line 04 through the test circuit board 06 to detect whether the scan driver circuit 03 of the display panel 10 works normally, or not. For example, the test signal from the first signal line 04 is transmitted to an oscilloscope, and whether the pixel circuit of the display panel 10 receiving the scan signals from the first signal lines 04 works normally or not is judged by the waveform of the oscilloscope, so as to judge whether the scan driver circuit 03 works normally, or not.

For example, referring to FIG. 7A, the test method includes: when testing each of the plurality of first signal lines 04, irradiating the test lead 05, the interlayer insulation layer, and the tested first signal line 04 at the preset position by the laser, and melting and fusing the test lead 05, the interlayer insulation layer, and the tested first signal line 04, so that the fused test lead 05 is electrically connected with the first signal line 04 at the preset position, and the preset position is located in an overlapping area where the orthographic projection of the tested first signal line 04 on the base substrate 01 overlaps with the orthographic projection of the corresponding test lead 05. For example, the preset position is located in an overlapping area where the orthographic projection of the second part 042 of the tested first signal line 04 on the base substrate 01 overlaps with the orthographic projection of the corresponding sub-lead 0521/ 0522/0523/0524 on the base substrate, that is, in the overlapping area of the first test pad of each first signal line 04 and the corresponding second test pad, and the first test pad and the corresponding second test pad are electrically connected to each other after being fused by the laser.

For example, when the display panel 10 shown in FIG. 8B is tested, the laser is incident on the preset position of the display panel 10 from the side of the base substrate 01 away from the first signal line 04 and the test lead 05; the laser sequentially reaches the base substrate 01, the first signal line 04, and the test lead 05. Because no conductive layer is arranged between the first signal line 04 and the base substrate 01, the laser light does not pass through any conductive layer between the first signal line 04 and the base substrate 01. After the laser passes through the base substrate 01 at the preset position, by controlling the parameters, such as the intensity of the laser, the laser can only act on the tested first signal line 04, the interlayer insulation layer 152, and the test lead 05 in sequence, but cannot act on any other conductive layer, thus preventing the effect on other conductive layers.

Or, for example, when the display panel 10 shown in FIG. 8C is tested, the laser sequentially reaches the base substrate 01, the test lead 05, and the first signal line 04. Because no conductive layer is arranged between the test lead 05 and the base substrate 01, the laser does not pass through any conductive layer between the test lead 05 and the base substrate 01. After the laser passes through the base substrate 01 at the preset position, by controlling the parameters, such as the intensity of the laser, the laser can only act on the test lead 05, the interlayer insulation layer 151, and the tested first signal line 04 in sequence, but cannot act on any other conductive layer, thus preventing the effect on other conductive layers.

Figure 10A:
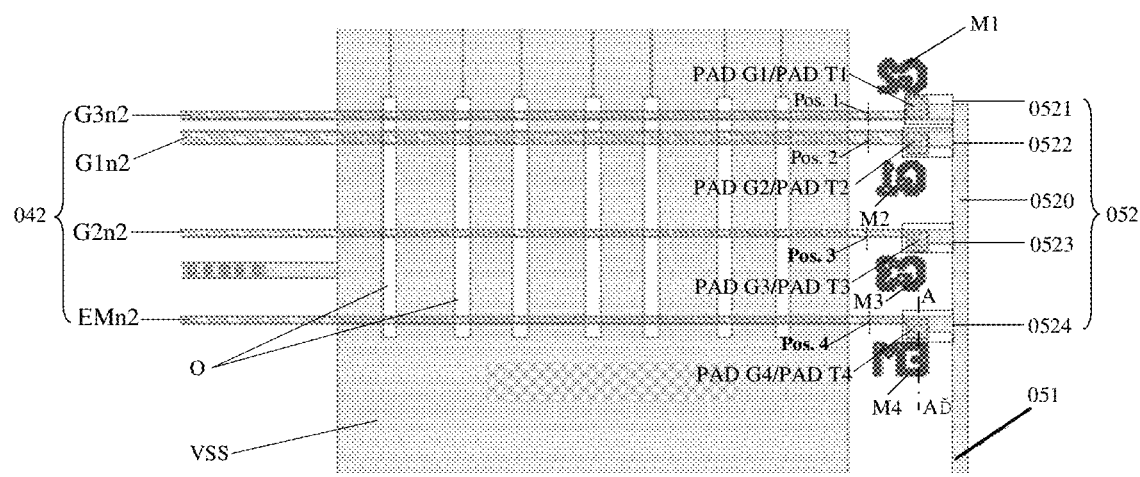
FIGS. 10A-10B are schematic diagrams of a test method for testing a display panel provided by at least one embodiment of the present disclosure.
Figure 10B:
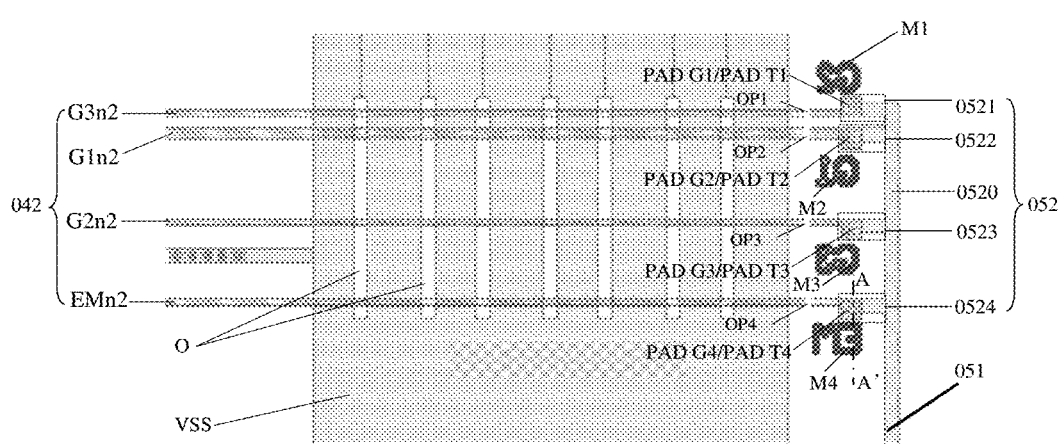

FIGS. 10A-10B are schematic diagrams of a teat method for testing a display panel provided by at least one embodiment of the present disclosure. For example, referring to FIG. 10A, the test method further includes: sequentially acquiring test signals output by a plurality of first signal lines 04 to sequentially test the plurality of first signal lines 04. After the test of the previous first signal line 04 of the plurality of first signal lines 04 is completed, and before the test of the next first signal line 04 of the plurality of first signal lines 04, the previous first signal line 04 is cut to form a break opening at the position where the previous first signal line 04 is cut, and the break opening is located in the non-display area 01B. For example, for the four first signal lines G3n/G1n/G2n/EMn, the test signals output by the first signal line G3n, the first signal line G1n, the first signal line G2n, and the first signal line EMn are sequentially acquired to test the first signal line G1n, the first signal line G2n, and the first signal line EMn. After the first signal line G3n has been tested, the first signal line G1n is cut at the position 1 (Pos. 1) to form a break opening OP1 at the position 1. The tested first signal line G3n includes an unconnected part and a connected part separated by the break opening OP1. The unconnected part is disconnected from the corresponding test lead 05, and the connected part is connected with the corresponding test lead 05. For example, the previous first signal line 04 can be cut by laser. Then, the first signal line G1n is tested by the same method as the first signal line G3n, and the first signal line G1n is cut at the position 2 (Pos. 2) to form the break opening OP2 at the position 2. Similarly, the first signal line G2n and the first signal line EMn are tested sequentially, and the break opening OP3 and the break opening OP4 are formed at the position 3 (Pos. 3) and the position 4 (Pos. 4), respectively. In this way, all the first signal lines 04 of the display panel 10 can be tested.

For example, the break unconnected parts of the plurality of first signal lines 04 that have been tested are arranged in the second direction perpendicular to the first direction. The space of the non-display area 01B in the second direction is sufficient, which is beneficial to the high accuracy of the laser positioning.

For example, the break openings of the second parts of the first signal lines 04 located on the same side of the display area 01A in the first direction are not located on the same straight line extending in the second direction, or are substantially located on the straight line extending in the second direction, so as to facilitate locating and maintaining the consistency of the second parts of the plurality of first signal lines, thereby maintaining the consistency of the signal transmission performance of the plurality of first signal lines.

What have been described above are only exemplary implementations of the present disclosure, the scope of the present disclosure is not limited thereto. The scope of the present disclosure should be defined based on the claims.

What is claimed is:

1. A display panel, comprising:
   a base substrate, comprising a display area and a non-display area at least partially surrounding the display area;
   a pixel array which is in the display area on the base substrate and comprises a plurality of pixel rows extending in a first direction, wherein each pixel row of the plurality of pixel rows comprises a first signal line and subpixels, and each subpixel comprises a pixel circuit, and the first signal line is configured to provide a scanning signal to the pixel circuit in the pixel row where the first signal line is located;
   a scan driver circuit configured to provide the scanning signal to the pixel circuit and comprises a shift register and a clock signal line that are in the display area;
   a test circuit board in the non-display area and comprising a test pad; and
   a test lead in the non-display area and electrically connected with the test pad, wherein the first signal line comprises a first part in the display area, and a second part that is in the non-display area and is connected with the first part, the first part extends substantially along the first direction, and the second part is connected with the first part;

before the display panel is tested, the first signal line and the test lead are arranged in different layers and insulated from each other; when the display panel is tested, the test lead and the second part of the first signal line are connected to each other, and the test circuit board is configured to acquire a test signal from the first signal line through the test pad and the test lead.

2. The display panel according to claim 1, wherein, before the display panel is tested, an orthographic projection of the second part of the first signal line on the base substrate at least partially overlaps with an orthographic projection of the test lead on the base substrate;

when the display panel is tested, an orthographic projection of a part of the second part of the first signal line on the base substrate overlaps with an orthographic projection of a part of the test lead on the base substrate, and the part of the second part of the first signal line is connected to the part of the test lead.

3. The display panel according to claim 2, further comprising:

an interlayer insulation layer, wherein, before the display panel is tested, the interlayer insulation layer is between the first signal line and the test lead to insulate the first signal line and the test lead, and the first signal line, the interlayer insulation layer and the test lead are configured to be melted by laser at a preset position to enable the first signal line to be electrically connected with the test lead at the preset position, and the preset position is located in an overlapping region where the orthographic projection of the first signal line on the base substrate overlaps with the orthographic projection of the test lead on the base substrate;

wherein the test circuit board is a chip on film (COF), and the test pads are spaced apart from each other in the chip on film.

4. The display panel according to claim 3, wherein, before the display panel is tested, the test lead is at a side of the first signal line away from the base substrate, and no conductive layer is between the first signal line and the base substrate; or, the test lead is on a side of the first signal line near the base substrate, and no conductive layer is between the test lead and the base substrate; and wherein the first signal line is a gate line.

5. The display panel according to claim 1, wherein a gap area is between adjacent pixel rows of the plurality of pixel rows, and the shift register and the clock signal line are in the gap area.

6. The display panel according to claim 1, wherein each pixel row of the plurality of pixel rows comprises a plurality of the first signal lines, the display panel comprises a plurality of the test pads and a plurality of the test leads, and each of the plurality of test pads is electrically connected with at least one test lead of the plurality of test leads in the non-display area;

before the display panel is tested, an orthographic projection of each of the plurality of test leads on the base substrate at least partially overlaps with an orthographic projection of the second parts of the plurality of first signal lines in at least one of the pixel rows of the display panel on the base substrate;

wherein, before the display panel is tested, the orthographic projection of each of the plurality of test leads on the base substrate at least partially overlaps with the orthographic projection of the second parts of the plurality of first signal lines of one same pixel row of the plurality of pixel rows on the base substrate, or, the orthographic projection of each of the plurality of test leads on the base substrate at least partially overlaps with the orthographic projection of the second parts of the plurality of first signal lines of adjacent pixel rows of the plurality of pixel rows on the base substrate.

7. The display panel according to claim 6, wherein no switch device is provided between each of the plurality of first signal lines and the test lead of which the orthographic projection overlaps with the orthographic projection of the each of the plurality of first signal lines; and wherein each of the plurality of test leads comprises:

a main lead comprising a first end connected with each of the test pads and a second end away from the test pads, wherein the second end extends along a second direction, and the second direction is substantially perpendicular to the first direction; and a plurality of sub-leads, which are connected with the second end of the main lead, protrude from the second end, and are provided in one-to-one correspondence with the first signal lines, wherein, before the display panel is tested, an orthographic projection of each of the sub-leads on the base substrate at least partially overlaps with the orthographic projection of the second part of the corresponding first signal line on the base substrate.

8. The display panel according to claim 7, wherein, before the display panel is tested, an end of the second part of each of the plurality of first signal lines that is near the corresponding sub-lead has a first test pad, and a width of the first test pad in a line width direction of the each of the plurality of first signal lines is larger than a line width of the each of the plurality of first signal lines;

a first end of each of the plurality of sub-leads is connected with the main lead, and a second end of each of the plurality of sub-leads has a second test pad, a width of the second test pad in a line width direction of the each of the plurality of sub-leads is larger than a line width of the each of the plurality of sub-leads;

an orthographic projection of the second test pad on the base substrate at least partially overlaps with an orthographic projection of the first test pad of the corresponding first signal line on the base substrate.

9. The display panel according to claim 8, wherein the first test pads of the plurality of first signal lines are spaced apart from each other along the second direction, the plurality of sub-leads in one-to-one correspondence with the plurality of first signal lines are spaced apart from each other along the second direction, and the second test pads of the plurality of sub-leads are spaced apart from each other along the second direction; and wherein the second part comprises:

a first transverse part extending along the first direction and connected with the first part, wherein an end of the first transverse part away from the first part comprises the first test pad, and the first transverse parts of the plurality of first signal lines are arranged along the second direction.

10. The display panel according to claim 8, wherein the second part comprises:

a first transverse part extending in the first direction and connected with the first part;

a first longitudinal part connected with the first transverse part and extending along the second direction; and
a second transverse part connected with the first longitudinal part and extending along the first direction,
wherein the end of the second transverse part away from the first longitudinal part comprises the first test pad, the first transverse parts of the plurality of first signal lines are arranged in the second direction, the second transverse parts of the plurality of first signal lines are arranged in the second direction, and the first test pads of the plurality of first signal lines are not on a same straight line extending along the second direction.

11. The display panel according to claim 6, wherein the pixel circuit comprises a light-emitting element, a driving transistor, a data writing transistor, and a storage capacitor; the data writing transistor is configured to transmit the data signal to the driving transistor under control of the scanning signal, and the driving transistor is configured to control magnitude of a driving current flowing through the light-emitting element according to the data signal; the storage capacitor comprises a first plate and a second plate, the first plate is electrically connected with a gate of the driving transistor, and an orthographic projection of the second plate on the base substrate at least partially overlaps with an orthographic projection of the first plate on the base substrate;
before the display panel is tested, the first signal lines are in a same layer as the first plate of the storage capacitor, and the test lead is in a same layer as the second plate of the storage capacitor, or the first signal lines are in a same layer as the first plate of the storage capacitor, and the display panel further comprises a light shielding layer, wherein the light shielding layer is on a side of the first signal lines near the base substrate, and an orthographic projection of the channel region of the driving transistor on the base substrate is within an orthographic projection of the light shielding layer on the base substrate, and the test leads are in a same layer as the light shielding layer.

12. The display panel according to claim 11, further comprising a plurality of alignment marks, wherein patterns of the plurality of alignment marks are different from each other, are provided in one-to-one correspondence with the plurality of first signal lines, and each of the alignment marks is spaced apart from the overlapping region of the corresponding first signal line; when the display panel is tested, the plurality of alignment marks are configured to be recognized by an alignment device to locate the preset positions in the overlapping areas of the corresponding first signal lines;
the alignment marks are in a same layer as any one selected from a group consisting of an active layer of the driving transistor, the first signal line and the test lead.

13. The display panel according to claim 6, wherein the non-display area comprises a first non-display area, a second non-display area, and a third non-display area, the first non-display area and the second non-display area are respectively on a first side and a second side of the display area in the first direction, and the third non-display area is on a first side of the display area in the second direction; the base substrate comprises a first edge that is near the first non-display area and extends in the second direction, a second edge that is near the second non-display area and extends in the second direction, and a third edge that is near the third non-display area and extends in the first direction;
the first signal lines of the plurality of pixel rows all extend from the display area to the first non-display area, and the first signal lines of the plurality of pixel rows are connected with the test leads in the first non-display area;
the plurality of test pads are in the third non-display area and arranged along the third edge of the base substrate, or, the plurality of test pads are in the first non-display area and arranged along the first edge of the base substrate.

14. The display panel according to claim 6, wherein the non-display area comprises a first non-display area, a second non-display area, and a third non-display area, the first non-display area and the second non-display area are respectively on a first side and a second side of the display area in the first direction, and the third non-display area is on a first side of the display area in the second direction; the base substrate comprises a first edge that is near the first non-display area and extends in the second direction, a second edge that is near the second non-display area and extends in the second direction, and a third edge that is near the third non-display area and extends in the first direction;
a first part of the first signal lines of the plurality of pixel rows extends from the display area to the first non-display area, and the first part of the first signal lines is connected with the test leads in the first non-display area; a second part of the first signal lines of the pixel rows extends from the display area to the second non-display area, and the second part of the first signal lines is connected with the test leads in the second non-display area;
a first part of the plurality of test pads is in the first non-display area and arranged along the first edge of the base substrate, and a second part of the plurality of test pads is in the second non-display area and arranged along the second edge of the base substrate, or,
the first part of the test pads and the second part of the test pads are both in the third non-display area and arranged along the third edge of the base substrate.

15. A display apparatus, comprising the display panel according to claim 1.

16. A test method of the display panel according to claim 1, comprising:
acquiring a test signal output by the first signal line through the test circuit board to detect whether the scan driver circuit works normally.

17. The test method according to claim 16, wherein, in a case where each pixel row of the plurality of pixel rows comprises a plurality of the first signal lines, the display panel comprises a plurality of the test pads and a plurality of the test leads, each of the plurality of test pads is electrically connected with at least one of the plurality of test leads in the non-display area, and before the display panel is tested, the first signal line and the test lead are in different layers and insulated from each other by an interlayer insulation layer, and an orthographic projection of the second part of the first signal line on the base substrate at least partially overlaps with an orthographic projection of the test lead on the base substrate,
the test method further comprises:
when each of the plurality of first signal lines is tested, the test lead, the interlayer insulation layer and the tested first signal line at a preset position are irradiated by laser, and the test lead, the interlayer insulation layer, and the tested first signal line are melted and fused, so that the fused test lead and the first signal line are electrically connected at the preset position, and the preset position is in an overlapping area where the tested first signal line overlaps with the corresponding test lead in a direction perpendicular to the base substrate;

wherein, in a case where each of the plurality of test leads comprises a main lead and a plurality of sub-leads, the main lead comprises a first end connected with each of the test pads and a second end away from the test pads, the plurality of sub-leads are connected with the second end of the main lead, protrude from the second end, and are provided in one-to-one correspondence with the first signal lines, before the display panel is tested, an orthographic projection of each of the sub-leads on the base substrate at least partially overlaps with the orthographic projection of the second part of the corresponding first signal line on the base substrate, the preset position is in an overlapping area where the orthographic projection of the second part of the tested first signal line overlaps with the orthographic projection of the corresponding sub-lead.

18. The test method according to claim 17, wherein the laser is incident on the preset position of the display panel from a side of the base substrate away from the first signal line and the test lead;

the laser sequentially reaches the base substrate, the first signal line, and the test lead without passing through any conductive layer that is between the first signal line and the base substrate;

or, the laser light sequentially reaches the base substrate, the test lead, and the first signal line without passing through any conductive layer that is between the test lead and the base substrate; and the test method further comprises:

acquiring test signals output by the plurality of first signal lines sequentially to test the plurality of first signal lines sequentially, wherein after the test of a previous one of the first signal lines is completed and before the test of a next one of the first signal lines is performed, the previous one of the first signal lines is cut off to form a break opening at a cut-off position of the previous first signal line, the break opening is in the non-display area;

the first signal line that has been tested comprises an unconnected part and a connected part that are separated by the break opening, the unconnected part is disconnected from the corresponding test lead, and the connected part is connected with the corresponding test lead.

19. The test method according to claim 18, wherein the previous one of the first signal lines is cut by laser; and wherein the break openings of a plurality of the first signal lines that have been tested are arranged in a second direction perpendicular to the first direction.

20. A display panel, comprising:

a base substrate comprising a display area and a non-display area at least partially surrounding the display area;

a pixel array which is in the display area of the base substrate and comprises a plurality of pixel rows extending in the first direction, wherein each pixel row of the plurality of pixel rows comprises a first signal line and subpixels, and each subpixel comprises a pixel circuit, and the first signal line is configured to provide a scanning signal to the pixel circuit in the pixel row where the first signal line is located;

a scan driver circuit configured to provide the scanning signal to the pixel circuit and comprising a shift register and a clock signal line that are in the display area;

a test circuit board in the non-display area and comprising a test pad; and a test lead in the non-display area and electrically connected with the test pad, wherein the first signal line comprises a first part in the display area, and a second part that is in the non-display area and connected with the first part, the first part extends substantially along the first direction, and the second part is connected with the first part;

the first signal line and the test lead are in different layers and insulated from each other, and an orthographic projection of the second part of the first signal line on the base substrate at least partially overlaps with an orthographic projection of the test lead on the base substrate.

* * * * *